United States Patent
Ruecker et al.

(10) Patent No.: US 10,429,742 B2
(45) Date of Patent: Oct. 1, 2019

(54) STITCHLESS DIRECT IMAGING FOR HIGH RESOLUTION ELECTRONIC PATTERNING

(71) Applicants: Orbotech Ltd., Yavne (IL); Laser Imaging Systems GmbH, Jena (DE)

(72) Inventors: Steffen Ruecker, Grossloebichau (DE); Stefan Heinemann, Jena (DE); Werner Eschke, Jena (DE); Abraham Gross, Ramat Aviv (IL)

(73) Assignees: Orbotech Ltd., Yavne (IL); Laser Imaging Systems GmbH, Jena (DE)

( * ) Notice: Subject to any disclaimer, the term of this patent is extended or adjusted under 35 U.S.C. 154(b) by 0 days.

(21) Appl. No.: 15/772,728

(22) PCT Filed: Nov. 2, 2016

(86) PCT No.: PCT/IL2016/051183
§ 371 (c)(1),
(2) Date: May 1, 2018

(87) PCT Pub. No.: WO2017/077532
PCT Pub. Date: May 11, 2017

(65) Prior Publication Data
US 2018/0321595 A1 Nov. 8, 2018

Related U.S. Application Data

(60) Provisional application No. 62/249,971, filed on Nov. 3, 2015.

(51) Int. Cl.
*G03F 7/20* (2006.01)

(52) U.S. Cl.
CPC .......... *G03F 7/70383* (2013.01); *G03F 7/704* (2013.01); *G03F 7/70025* (2013.01);
(Continued)

(58) Field of Classification Search
CPC ............ G03F 7/70025; G03F 7/70275; G03F 7/70291; G03F 7/70383; G03F 7/704; G03F 7/70466; G03F 7/70475
(Continued)

(56) References Cited

U.S. PATENT DOCUMENTS

| 4,924,257 A | 5/1990 | Jain |
| 6,149,856 A | 11/2000 | Zemel et al. |

(Continued)

FOREIGN PATENT DOCUMENTS

JP 2004-87715 A 3/2004

OTHER PUBLICATIONS

International Search Report for PCT/IL2016/051183 dated Feb. 2, 2017 [PCT/ISA/210].

(Continued)

*Primary Examiner* — Colin W Kreutzer
(74) *Attorney, Agent, or Firm* — Sughrue Mion, PLLC

(57) ABSTRACT

A method of manufacture of objects including receiving a CAD file containing electrical circuit design data for direct writing on a surface, the CAD file including CAD data for a multiplicity of objects to be produced on the surface, automatically configuring a direct write machine to direct write direct writing data based on the CAD data on the surface in plural scans, each having a scan width less than a width of the surface, including arranging the direct writing data for the multiplicity of objects to be written in a side by side manner in each of the plural scans so as to be within the scan width, whereby stitching of direct writing data between adjacent scans is obviated and operating the direct write machine to create the multiplicity of objects on the surface.

16 Claims, 12 Drawing Sheets

(52) U.S. Cl.
CPC ...... *G03F 7/70275* (2013.01); *G03F 7/70291* (2013.01); *G03F 7/70433* (2013.01); *G03F 7/70466* (2013.01); *G03F 7/70475* (2013.01); *G03F 7/70525* (2013.01)

(58) Field of Classification Search
USPC .............................................. 355/53, 54, 77
See application file for complete search history.

(56) References Cited

U.S. PATENT DOCUMENTS

| | | | | |
|---|---|---|---|---|
| 2005/0105071 A1* | 5/2005 | Ishii | .................... | G03F 7/70291 355/53 |
| 2006/0033897 A1* | 2/2006 | Okuyama | .............. | G03B 27/42 355/53 |
| 2006/0092419 A1* | 5/2006 | Gui | .................... | G03F 7/70216 356/401 |
| 2007/0055467 A1 | 3/2007 | Tsuji et al. | | |
| 2008/0299492 A1* | 12/2008 | Kiuchi | ................ | G03F 7/70258 430/311 |
| 2009/0268184 A1* | 10/2009 | Lin | ........................ | B82Y 10/00 355/67 |
| 2010/0266960 A1* | 10/2010 | Mashita | ................ | G03B 27/42 430/312 |
| 2012/0307222 A1* | 12/2012 | Van Zwet | ............... | G03F 7/704 355/67 |
| 2013/0120724 A1 | 5/2013 | Wieland et al. | | |
| 2015/0268036 A1* | 9/2015 | Berg | ..................... | G03F 7/0002 356/511 |
| 2016/0238941 A1* | 8/2016 | Bencher | .................. | G03F 7/24 |

OTHER PUBLICATIONS

Communication dated Jun. 3, 2019, issued by the European Patent Office in corresponding application No. 16861723.1.

* cited by examiner

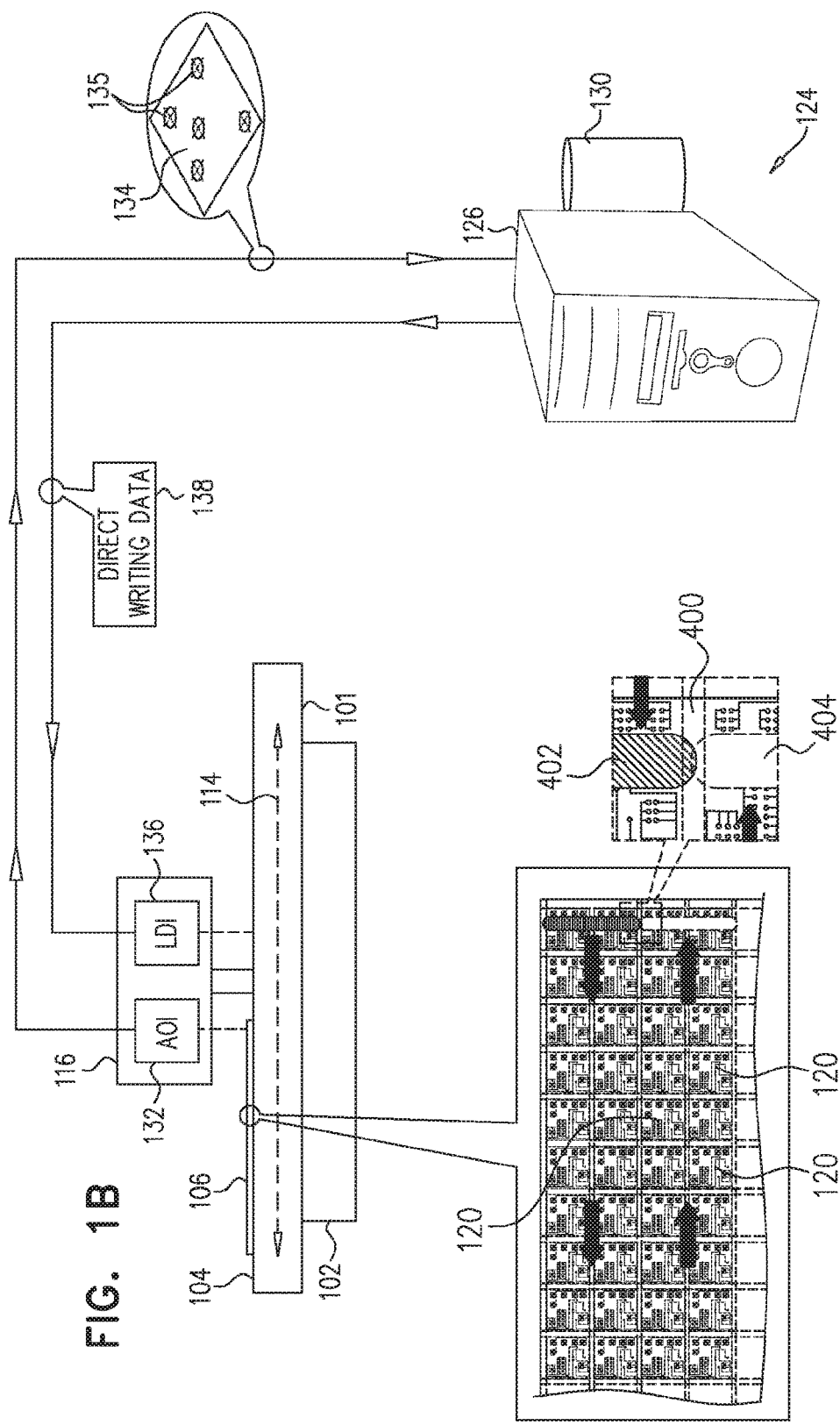

STITCHLESS DIRECT IMAGING FOR HIGH RESOLUTION ELECTRONIC PATTERNING

CROSS REFERENCE TO RELATED APPLICATIONS

This application is a National Stage of International Application No. PCT/IL2016/051183, filed on Nov. 2, 2016, which claims priority from U.S. Patent Application No. 62/249,971, filed on Nov. 3, 2015, the entireties of which are incorporated herein by reference.

FIELD OF THE INVENTION

The present invention relates to direct imaging and more particular to laser direct imaging electronic patterning.

BACKGROUND OF TILE INVENTION

Various types of direct imaging systems are known.

SUMMARY OF THE INVENTION

The present invention seeks to provide an improved direct imaging system for high resolution electronic patterning.

There is thus provided in accordance with a preferred embodiment of the present invention a method of manufacture of objects including receiving a CAD file containing electrical circuit design data for direct writing on a surface, the CAD file including CAD data for a multiplicity of objects to be produced on the surface, automatically configuring a direct write machine to direct write direct writing data based on the CAD data on the surface in plural scans, each having a scan width less than a width of the surface, including arranging the direct writing data for the multiplicity of objects to be written in a side by side manner in each of the plural scans so as to be within the scan width, whereby stitching of direct writing data between adjacent scans is obviated and operating the direct write machine to create the multiplicity of objects on the surface.

Preferably, the method also includes performing optical imaging of the surface.

Preferably, the automatically configuring includes modifying data derived from the CAD file to take into account at least one of inaccuracies and distortions in at least one of a configuration and location of the surface, as found by the optical imaging.

Preferably, the direct writing data is configured such that no object is written by more than a single scan.

In accordance with a preferred embodiment of the present invention, objects are formed of multiple layers, the multiple layers being sequentially written over each other in registration and the automatically configuring includes automatically configuring the direct write machine to direct write direct writing data for each of the multiple layers based on the CAD data on the surface in the plural scans, each having a scan width less than the width of the surface including arranging the direct writing data for the multiple layers of the multiplicity of objects to be written in a side by side manner in each of the plural scans so as to be within the scan width, whereby stitching of direct writing data between adjacent scans is obviated Preferably, an extent of each scan of the plural scans is defined by a scan seam, the direct writing data being configured such that each the scan seam is located between the objects and not overlying the objects.

Preferably, scan seams of adjacent ones of the plural scans are mutually spaced. Alternatively, scan seams of adjacent ones of the plural scans are butting. Further alternatively, scan seams of adjacent ones of the plural scans are overlapping.

Preferably, the surface includes a flat panel display and the objects include cells of the flat panel display.

Alternatively, the surface includes a wafer and the objects include dies.

Preferably, the direct write machine includes a single read/write assembly, the plural scans being sequentially performed by the read/write assembly.

Alternatively, the direct write machine includes two or more read/write assemblies, the plural scans being performed by the read/write assemblies operating at least partially mutually simultaneously.

There is further provided in accordance with another preferred embodiment of the present invention a method of configuring a direct write machine including receiving a CAD file containing electrical circuit design data for direct writing on a surface, the CAD file including CAD data for a multiplicity of objects to be produced on the surface and automatically configuring a direct write machine to direct write direct writing data based on the CAD data on the surface in plural scans, each having a scan width less than a width of the surface, including arranging the direct writing data for the multiplicity of objects to be written in a side by side manner in each of the plural scans so as to be within the scan width, whereby stitching of direct writing data between adjacent scans is obviated.

Preferably, the method of configuring a direct write machine also includes performing optical imaging of the surface.

Preferably, the automatically configuring includes modifying data derived from the CAD file to take into account at least one of inaccuracies and distortions in at least one of a configuration and location of the surface, as found by the optical imaging.

Preferably, the direct writing data is configured such that no object is written by more than a single scan.

In accordance with a preferred embodiment of the method of configuring a direct write machine of the present invention, the objects are formed of multiple layers, the multiple layers being sequentially written over each other in registration and the automatically configuring includes automatically configuring the direct write machine to direct write direct writing data for each of the multiple layers based on the CAD data on the surface in plural scans, each having a scan width less than a width of the surface, including arranging the direct writing data for the multiple layers of the multiplicity of objects to be written in a side by side manner in each of the plural scans so as to be within the scan width, whereby stitching of direct writing data between adjacent scans is obviated.

Preferably, an extent of each scan of the plural scans is defined by a scan seam, the direct writing data being configured such that each the scan seam is located between the objects and not overlying the objects.

Preferably, scan seams of adjacent ones of the plural scans are mutually spaced. Alternatively, scan seams of adjacent ones of the plural scans are butting. Further alternatively, scan seams of adjacent ones of the plural scans are overlapping.

Preferably, the surface includes a flat panel display and the objects include cells of the flat panel display.

Alternatively, the surface includes a wafer and the objects include dies.

Preferably, the direct write machine includes a single read/write assembly, the plural scans being sequentially performed by the read/write assembly.

Alternatively, the direct write machine includes two or more read/write assemblies, the plural scans being performed by the read/write assemblies operating at least partially mutually simultaneously.

There is additionally provided in accordance with a further preferred embodiment of the present invention a system for manufacture of objects including a direct write machine and an automatic direct writing machine configuration (ADWMC) unit receiving a CAD file containing electrical circuit design data for direct writing on a surface, the CAD file including CAD data for a multiplicity of objects to be produced on the surface and automatically configuring the direct write machine to direct write direct writing data based on the CAD data on the surface in plural scans, each having a scan width less than a width of the surface, including arranging the direct writing data for the multiplicity of objects to be written in a side by side manner in each of the plural scans so as to be within the scan width, whereby stitching of direct writing data between adjacent scans is obviated.

Preferably, the system also includes an optical imager for performing optical imaging of the surface.

Preferably, the ADWMC unit modifies data derived from the CAD file to take into account at least one of inaccuracies and distortions in at least one of a configuration and location of the surface, as found by the optical imaging.

Preferably, the direct writing data is configured such that no object is written by more than a single scan.

In accordance with a preferred embodiment of the system for manufacture of objects of the present invention, the objects are formed of multiple layers, the multiple layers being sequentially written over each other in registration and the ADWMC unit automatically configures the direct write machine to direct write direct writing data for each of the multiple layers based on the CAD data on the surface in plural scans, each having a scan width less than a width of the surface, including arranging the direct writing data for the multiple layers of the multiplicity of objects to be written in a side by side manner in each of the plural scans so as to be within the scan width, whereby stitching of direct writing data between adjacent scans is obviated.

Preferably, an extent of each scan of the plural scans is defined by a scan seam, the direct writing data being configured such that each the scan seam is located between the objects and not overlying the objects.

Preferably, the scan seams of adjacent ones of the plural scans are mutually spaced. Alternatively, scan seams of adjacent ones of the plural scans are butting. Further alternatively, scan seams of adjacent ones of the plural scans are overlapping.

Preferably, the surface includes a flat panel display and the objects include cells of the flat panel display.

Alternatively, the surface includes a wafer and the objects include dies.

Preferably, the direct write machine includes a single read/write assembly, the plural scans being sequentially performed by the read/write assembly.

Alternatively, the direct write machine includes two or more read/write assemblies, the plural scans being performed by the read/write assemblies operating at least partially mutually simultaneously.

There is also provided in accordance with yet another preferred embodiment of the present invention a system for configuring a direct write machine including an automatic direct write machine configuration (ADWMC) unit receiving a CAD file containing electrical circuit design data for direct writing on a surface, the CAD file including CAD data for a multiplicity of objects to be produced on the surface and automatically configuring a direct write machine to direct write direct writing data based on the CAD data on the surface in plural scans, each having a scan width less than a width of the surface including arranging the direct writing data for the multiplicity of objects to be written in a side by side manner in each of the plural scans so as to be within the scan width, whereby stitching of direct writing data between adjacent scans is obviated.

Preferably, the system for configuring a direct write machine of the present invention also includes an optical imager for performing optical imaging of the surface.

Preferably, the ADWMC unit modifies data derived from the CAD file to take into account at least one of inaccuracies and distortions in at least one of a configuration and location of the surface, as found by the optical imaging.

Preferably, the direct writing data is configured such that no object is written by more than a single scan.

In accordance with a preferred embodiment of the system for configuring a direct write machine of the present invention, the objects are formed of multiple layers, the multiple layers being sequentially written over each other in registration, and the ADWMC unit automatically configures the direct write machine to direct write direct writing data for each of the multiple layers based on the CAD data on the surface in plural scans, each having a scan width less than a width of the surface including arranging the direct writing data for the multiple layers of the multiplicity of objects to be written in a side by side manner in each of the plural scans so as to be within the scan width, whereby stitching of direct writing data between adjacent scans is obviated.

Preferably, an extent of each scan of the plural scans is defined by a scan seam, the direct writing data being configured such that each the scan seam is located between the objects and not overlying the objects.

Preferably, scan seams of adjacent ones of the plural scans are mutually spaced. Alternatively, scan seams of adjacent ones of the plural scans are butting. Further alternatively, scan seams of adjacent ones of the plural scans are overlapping.

Preferably, the surface includes a flat panel display and the objects include cells of the flat panel display.

Alternatively, the surface includes a wafer and the objects include dies.

Preferably, the direct write machine includes a single read/write assembly, the plural scans being sequentially performed by the read/write assembly.

Alternatively, the direct write machine includes two or more read/write assemblies, the plural scans being performed by the read/write assemblies operating at least partially mutually simultaneously.

There is still further provided in accordance with yet a further preferred embodiment of the present invention a method of manufacture of electrical circuits including receiving a CAD file containing electrical circuit design data for direct writing on a substrate, the CAD file including CAD data for a multiplicity of dies to be produced on the substrate automatically configuring a direct write machine to direct write direct writing data based on the CAD data on the substrate in plural scans, each having a scan width less than a width of the substrate, including arranging the direct writing data for the multiplicity of dies to be written in a side by side manner in each of the plural scans so as to be within the scan width, whereby stitching of direct writing data between adjacent scans is obviated and operating the direct write machine to create the multiplicity of dies on the substrate.

Preferably, the method of manufacture of electrical circuits of the present invention also includes performing optical imaging of the substrate.

Preferably, the automatically configuring includes modifying data derived from the CAD file to take into account at least one of inaccuracies and distortions in at least one of a configuration and location of the substrate, as found by the optical imaging.

Preferably, the direct writing data is configured such that no die is written by more than a single scan.

In accordance with a preferred embodiment of the method of manufacture of electrical circuits of the present invention, the dies are formed of multiple layers, the multiple layers being sequentially written over each other in registration and the automatically configuring includes automatically configuring the direct write machine to direct write direct writing data for each of the multiple layers based on the CAD data on the substrate in the plural scans, each having a scan width less than the width of the substrate including arranging the direct writing data for the multiple layers of the multiplicity of dies to be written in a side by side manner in each of the plural scans so as to be within the scan width, whereby stitching of direct writing data between adjacent scans is obviated.

Preferably, an extent of each scan of the plural scans is defined by a scan seam, the direct writing data being configured such that each the scan seam is located between the dies and not overlying the dies.

Preferably, scan seams of adjacent ones of the plural scans are mutually spaced. Alternatively, scan seams of adjacent ones of the plural scans are butting. Further alternatively, scan seams of adjacent ones of the plural scans are overlapping.

Preferably, the direct write machine includes a single read/write assembly, the plural scans being sequentially performed by the read/write assembly.

Alternatively, the direct write machine includes two or more read/write assemblies, the plural scans being performed by the read/write assemblies operating at least partially mutually simultaneously.

There is furthermore provided in accordance with still another preferred embodiment of the present invention a method of configuring a direct write machine including receiving a CAD file containing electrical circuit design data for direct writing on a substrate, the CAD file including CAD data for a multiplicity of dies to be produced on the substrate and automatically configuring a direct write machine to direct write direct writing data based on the CAD data on the substrate in plural scans, each having a scan width less than a width of the substrate including arranging the direct writing data for the multiplicity of dies to be written in a side by side manner in each of the plural scans so as to be within the scan width, whereby stitching of direct writing data between adjacent scans is obviated.

Preferably, the method of configuring a direct write machine of the present invention also includes performing optical imaging of the substrate.

Preferably, the automatically configuring includes modifying data derived from the CAD file to take into account at least one of inaccuracies and distortions in at least one of a configuration and location of the substrate, as found by the optical imaging.

Preferably, the direct writing data is configured such that no die is written by more than a single scan.

In accordance with a preferred embodiment of the method of configuring a direct write machine of the present invention the dies are formed of multiple layers, the multiple layers being sequentially written over each other in registration and the automatically configuring includes automatically configuring the direct write machine to direct write direct writing data for each of the multiple layers based on the CAD data on the substrate in plural scans, each having a scan width less than a width of the substrate, including arranging the direct writing data for the multiple layers of the multiplicity of dies to be written in a side by side manner in each of the plural scans so as to be within the scan width, whereby stitching of direct writing data between adjacent scans is obviated.

Preferably, an extent of each scan of the plural scans is defined by a scan seam, the direct writing data being configured such that each the scan seam is located between the dies and not overlying the dies.

Preferably, scan seams of adjacent ones of the plural scans are mutually spaced. Alternatively, scan seams of adjacent ones of the plural scans are butting. Further alternatively, scan seams of adjacent ones of the plural scans are overlapping.

Preferably, the direct write machine includes a single read/write assembly, the plural scans being sequentially performed by the read/write assembly.

Alternatively, the direct write machine includes two or more read/write assemblies, the plural scans being performed by the read/write assemblies operating at least partially mutually simultaneously.

There is also provided in accordance with another additional preferred embodiment of the present invention a system for manufacture of electrical circuits including a direct write machine and an automatic direct write machine configuration (ADWMC) unit receiving a CAD file containing electrical circuit design data for direct writing on a substrate, the CAD file including CAD data for a multiplicity of dies to be produced on the substrate and automatically configuring the direct write machine to direct write direct writing data based on the CAD data on the substrate in plural scans, each having a scan width less than a width of the substrate, including arranging the direct writing data for the multiplicity of dies to be written in a side by side manner in each of the plural scans so as to be within the scan width, whereby stitching of direct writing data between adjacent scans is obviated.

Preferably, the system for manufacture of electrical circuits according to claim 81 also includes an optical imager for performing optical imaging of the substrate.

Preferably, the ADWMC unit modifies data derived from the CAD file to take into account at least one of inaccuracies and distortions in at least one of a configuration and location of the substrate, as found by the optical imaging.

Preferably, the direct writing data is configured such that no die is written by more than a single scan.

In accordance with a preferred embodiment of the system for manufacture of electrical circuits according to the present invention, the dies are formed of multiple layers, the multiple layers being sequentially written over each other in registration and the ADWMC unit automatically configures the direct write machine to direct write direct writing data for each of the multiple layers based on the CAD data on the substrate in plural scans, each having a scan width less than a width of the substrate, including arranging the direct writing data for the multiple layers of the multiplicity of dies to be written in a side by side manner in each of the plural scans so as to be within the scan width, whereby stitching of direct writing data between adjacent scans is obviated.

Preferably, an extent of each scan of the plural scans is defined by a scan seam, the direct writing data being configured such that each the scan seam is located between the dies and not overlying the dies.

Preferably, scan seams of adjacent ones of the plural scans are mutually spaced. Alternatively, scan seams of adjacent ones of the plural scans are butting. Further alternatively, scan seams of adjacent ones of the plural scans are overlapping.

Preferably, the direct write machine includes a single read/write assembly, the plural scans being sequentially performed by the read/write assembly.

Alternatively, the direct write machine includes two or more read/write assemblies, the plural scans being performed by the read/write assemblies operating at least partially mutually simultaneously.

There is still additionally provided in accordance with another preferred embodiment of the present invention a system for configuring a direct write machine including an automatic direct write machine configuration (ADWMC) unit receiving a CAD file containing electrical circuit design data for direct writing on a substrate, the CAD file including CAD data for a multiplicity of dies to be produced on the substrate and automatically configuring a direct write machine to direct write direct writing data based on the CAD data on the substrate in plural scans, each having a scan width less than a width of the substrate including arranging the direct writing data for the multiplicity of dies to be written in a side by side manner in each of the plural scans so as to be within the scan width, whereby stitching of direct writing data between adjacent scans is obviated Preferably, the system for configuring a direct write machine of the present invention also includes an optical imager for performing optical imaging of the substrate.

Preferably, ADWMC unit modifies data derived from the CAD file to take into account at least one of inaccuracies and distortions in at least one of a configuration and location of the substrate, as found by the optical imaging.

Preferably, the direct writing data is configured such that no die is written by more than a single scan.

In accordance with a preferred embodiment of the system for configuring a direct write machine of the present invention, the dies are formed of multiple layers, the multiple layers being sequentially written over each other in registration and the ADWMC unit automatically configures the direct write machine to direct write direct writing data for each of the multiple layers based on the CAD data on the substrate in plural scans, each having a scan width less than a width of the substrate including arranging the direct writing data for the multiple layers of the multiplicity of dies to be written in a side by side manner in each of the plural scans so as to be within the scan width, whereby stitching of direct writing data between adjacent scans is obviated.

Preferably, an extent of each scan of the plural scans is defined by a scan seam, the direct writing data being configured such that each the scan seam is located between the dies and not overlying the dies.

Preferably, scan seams of adjacent ones of the plural scans are mutually spaced. Alternatively, scan seams of adjacent ones of the plural scans are butting. Further alternatively, scan seams of adjacent ones of the plural scans are overlapping.

Preferably, the direct write machine includes a single read/write assembly, the plural scans being sequentially performed by the read/write assembly.

Alternatively, the direct write machine includes two or more read/write assemblies, the plural scans being performed by the read/write assemblies operating at least partially mutually simultaneously.

BRIEF DESCRIPTION OF THE DRAWINGS

The present invention will be understood and appreciated more fully from the following detailed description, taken in conjunction with the drawings in which:

FIGS. 1A and 1B are simplified illustrations of a system for computerized direct writing constructed and operative in accordance with one preferred embodiment of the present invention.

DETAILED DESCRIPTION OF PREFERRED EMBODIMENTS

Figure 1A:
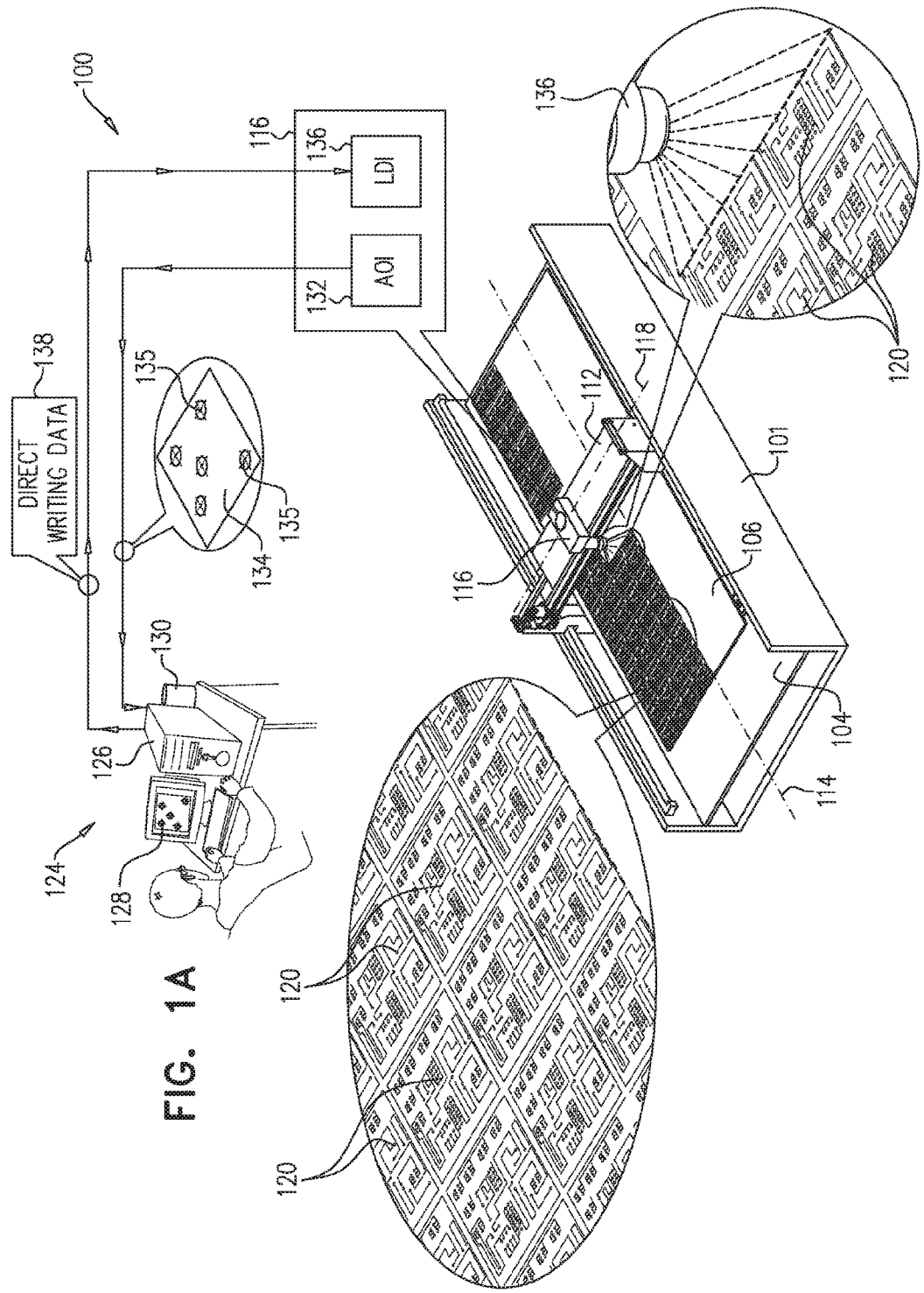

Reference is now made to FIGS. 1A and 1B, which are simplified illustrations of a system for computerized direct writing constructed and operative in accordance with a preferred embodiment of the present invention.

As seen in FIGS. 1A and 1B, there is provided a system 100 for computerized direct writing, preferably comprising a chassis 101 which is preferably mounted on a conventional optical supporting table 102. Chassis 101 preferably defines a substrate support surface 104 onto which a substrate 106 to be patterned may be placed. The substrate 106 may comprise any substrate suitable for computerized direct writing to be performed thereon and the patterning typically defines objects on at least one surface of substrate 106 by exposing photoresist overlying the surface to laser light. The direct writing process preferably prints a multiplicity of objects, which objects are arranged on the surface in accordance with a preferred embodiment of the present invention.

It should be appreciated that the term object as used herein refers to any unit that may be patterned by computerized direct writing onto substrate 106, which unit is typically spaced apart from other neighboring units patterned on the substrate. Such units may include, by way of non-limiting example, integrated circuit dies, fan out dies, cells forming part of a flat panel display and electronic circuitry modules on a PCB.

Substrate 106 is typically a panel or wafer and may comprise glass, polyimide or any other plastic, rigid or flexible, material. Furthermore, substrate 106 may be a flexible substrate bonded to a rigid support layer such as glass during production and subsequently removed therefrom following production. Additionally or alternatively, substrate 106 may be constructed of embedded objects, such as dies embedded in a bonding material, such as an epoxy compound. Various exemplary embodiments of substrate 106 and corresponding objects patterned thereon are provided henceforth with reference to FIGS. 2A-3B.

A bridge 112 is arranged for linear motion relative to substrate support surface 104 along an axis parallel to a first axis 114, defined with respect to chassis 101. In other embodiments (not shown) the bridge may be static and the support surface along with the substrate placed on it move, or both bridge and support surface move relative to each other. At least one read/write assembly is preferably located along bridge 112. Here, by way of example, a single read/write assembly 116 is arranged for selectable positioning relative to bridge 112 along a second axis 118, perpendicular to first axis 114, thereby to enable multiple sequential parallel scans to be carried out over substrate 106, each scan producing a multiplicity of objects 120.

Alternatively, a plurality of ones of read/write assembly 116 may be arranged in a side-by-side fashion on bridge 112 along axis 118, thereby to enable plural scans to be simultaneously or partially simultaneously carried out by corresponding ones of the plurality of assemblies 116 over substrate 106, each scan producing a plurality of objects 120. Such plural scans are preferably but not necessarily parallel.

Objects 120 are preferably but not necessarily identical and may be arranged one after the other in a direction parallel to axis 114 and side-by-side parallel to axis 118, as illustrated in FIGS. 1A and 1B. Alternatively, objects 120 may be arranged in a non-linear repeating or non-repeating pattern.

System 100 preferably also includes a control assembly 124, preferably including a computer 126 having a user interface 128. Computer 126 preferably includes software modules operative to operate read/write assembly 116.

Control assembly 124 also preferably includes a writing instruction database 130 containing computer aided design (CAD) instructions used, in accordance with an embodiment of the present invention for writing objects 120, on at least one surface of substrate 106.

In accordance with a preferred embodiment of the present invention, at least one read/write assembly 116 preferably includes an automated optical imaging subsystem (AOI) 132 operable for optically imaging substrate 106 to provide optical images 134 of substrate 106 to computer 126. Such optical images 134 may include optical images of fiducials 135 on substrate 106, which fiducials 135 may be useful in registration and/or calibration of system 100.

Read/write assembly 116 further preferably includes a direct imaging subsystem such as a laser direct imaging subsystem (LDI) 136 including an optical writer operable for laser writing onto substrate 106 for producing objects 120 in response to direct writing data 138 received from computer 126. It is appreciated that although both AOI subsystem 132 and LDI subsystem 136 are referred to herein as types of imaging subsystems, the imaging performed by each of the subsystems is of a mutually differing nature. AOI subsystem 132 performs optical imaging of substrate 106 in order to acquire optical images thereof, at least for the purpose of registration and calibration of system 100 prior to performance of direct writing on substrate 106. In contrast, LDI subsystem 136 performs direct writing on substrate 106 by laser imaging of a pattern onto substrate 106.

By way of example, LDI 136 may comprise a laser scanner of the type described in U.S. Pat. No. 8,531,751, assigned to the same assignee as the present invention. Other examples of direct imaging systems suitable for use with the present invention include a Direct Imaging System, model no. DW-3000, available from SCREEN Semiconductor of Tokyo, Japan and a Maskless Aligner System, model no. MLA 150, available from HEIDELBERG Instruments of Heidelberg, Germany.

Preferably, control assembly 124 and computer 126 thereof, receives from database 130 a CAD file containing electrical circuit design data for direct writing on substrate 106, the CAD file including CAD data for multiplicity of objects 120 to be produced on substrate 106.

Preferably, the control assembly 124 and more particularly computer 126 automatically configures the at least one read/write assembly 116 to direct write direct writing data based on the CAD data on the substrate 106 in plural parallel scans, each having a scan width less than the width of the substrate. Such plural parallel scans may be performed sequentially by a single repositionable read/write assembly, as illustrated here, or may be performed simultaneously or partially simultaneously by a plurality of read/write assemblies.

It is appreciated that the at least one read/write assembly 116 is thus a particularly preferred embodiment of a direct-write machine, operative to direct write direct writing data on substrate 106. It is further appreciated that control assembly 124 including computer 126 may correspondingly be termed an automatic direct write machine configuration (ADWMC) unit, operative to receive a CAD file containing electrical circuit design data for direct writing on at least one surface of substrate 106 and to automatically configure the direct write machine comprising at least one read/write assembly 116 to direct write direct writing data based on the CAD data on substrate 106 in plural scans.

It is a particular feature of a preferred embodiment of the present invention that the control assembly 124 and more particularly computer 126 automatically configures the direct writing data for the multiplicity of objects 120 to be written in a side by side manner in each of the plural scans so as to be within the scan width, so that no object is written in multiple scans, thereby obviating the need for stitching of direct writing data between adjacent scans.

Preferably the read/write assembly 116 is operated by the control assembly 124 to create multiplicity of objects 120 on the substrate 106 in plural scan passes, wherein the seam of adjacent scan passes is not located within an object, thereby obviating the need for stitching direct writing data between adjacent scans. The seam of adjacent scan passes may be an overlapping, a butting or a mutually spaced arrangement as will be described hereinbelow with reference to FIGS. 4A-4C. In accordance with a preferred embodiment of the present invention, irrespective of what type of seam exists, the seam is arranged to be between objects and not overlying objects.

It is appreciated that plural scan passes are typically required in order to scan a full width of substrate 106, due to an inherent limitation in the maximum scan length provided by LDI 136. Such plural scan passes may either be sequentially performed by a single repositionable scan head or at least partially simultaneously performed by a number of scans heads operating in parallel. This limitation in the scan length is dictated, among other factors, by a critical ratio that must be maintained between the required size of the focused laser beam performing direct writing on the substrate surface and the scan length of the scanning lens of LDI 136.

Were it not for the direct writing data for the multiplicity of objects 120 being written in each of the scans so as to be within the scan width, with the seam of adjacent scan passes located between rather than overlying objects 120, as provided by the present invention, adjacent scan passes of the plural required scans would typically overly the objects. Consequently, in the absence of the automatic direct writing configuration provided by the present invention, electrical circuit features within the objects would inevitably be exposed by more than one scan pass, leading to stitching effects due to mechanical and optical errors aggregated at the overlap between scan passes. Such stitching effects, as well as various complex techniques typically required in order to mitigate the influence thereof, are advantageously obviated in the present invention due to avoidance of overlap between scan passes.

It is understood that substrate 106 is not limited to being a single-layer substrate having only single-layer objects 120 patterned thereon. Rather, system 100 may be employed in an additive manner, so as to selectively modify a substrate layer by layer in order to create a three dimensional structure. Objects 120 may thus be formed of multiple layers, which multiple layers may be sequentially written over each other in registration by read/write assembly 116. In the case that objects 120 are formed of multiple layers, read/write assembly 116 is preferably automatically configured to direct write direct writing data for each of the multiple layers in plural scans in accordance with the manner detailed hereinabove, wherein each scan has a scan width less than a width of the surface of substrate 106, including arranging the direct writing data for the multiple layers of the objects 120 to be written in a side by side manner in each of the plural scans so as to be within the scan width, whereby stitching of direct writing data between adjacent scans is obviated.

Figure 2A:
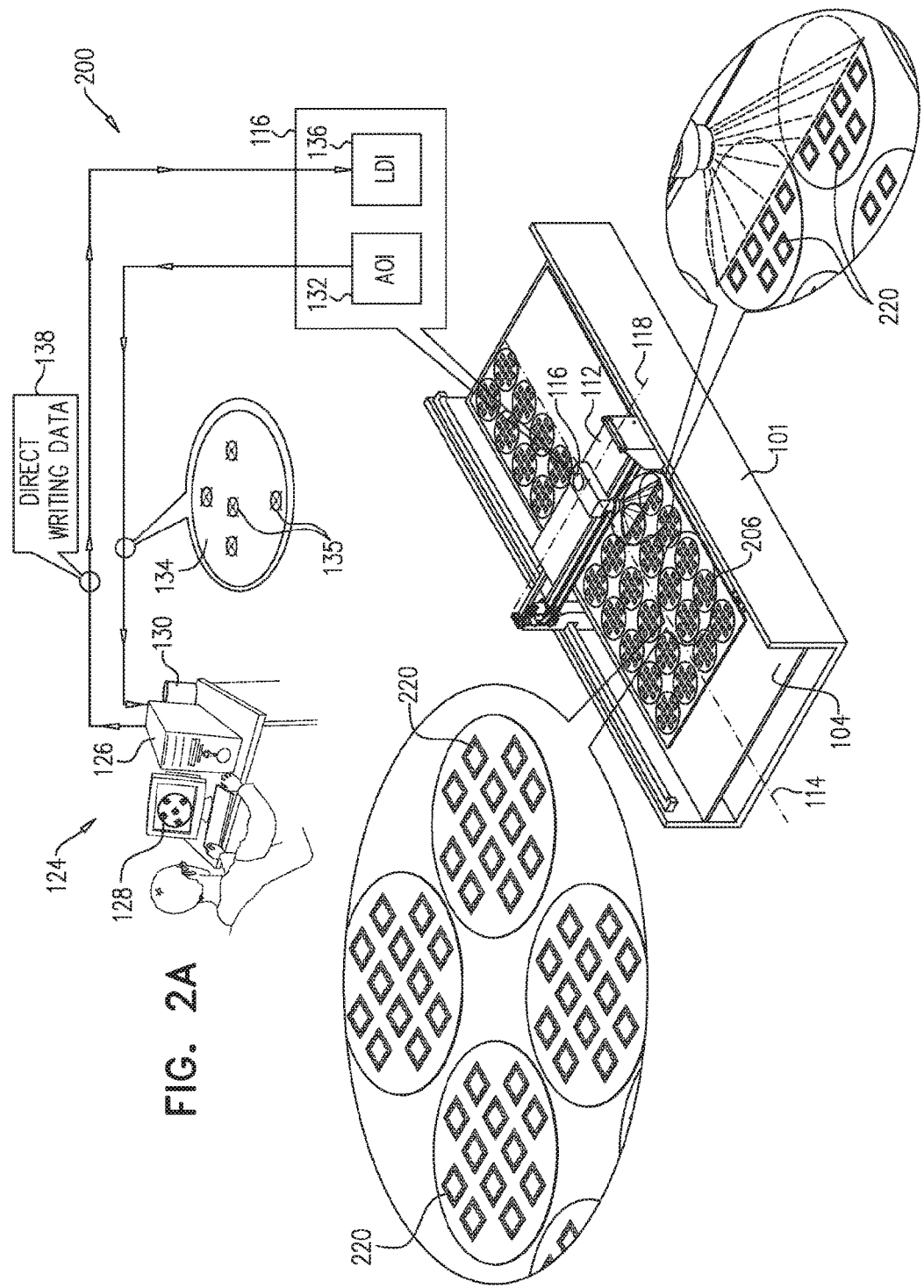
FIGS. 2A and 2B are simplified illustrations of a system for computerized direct writing constructed and operative in accordance with another preferred embodiment of the present invention.
Figure 2B:
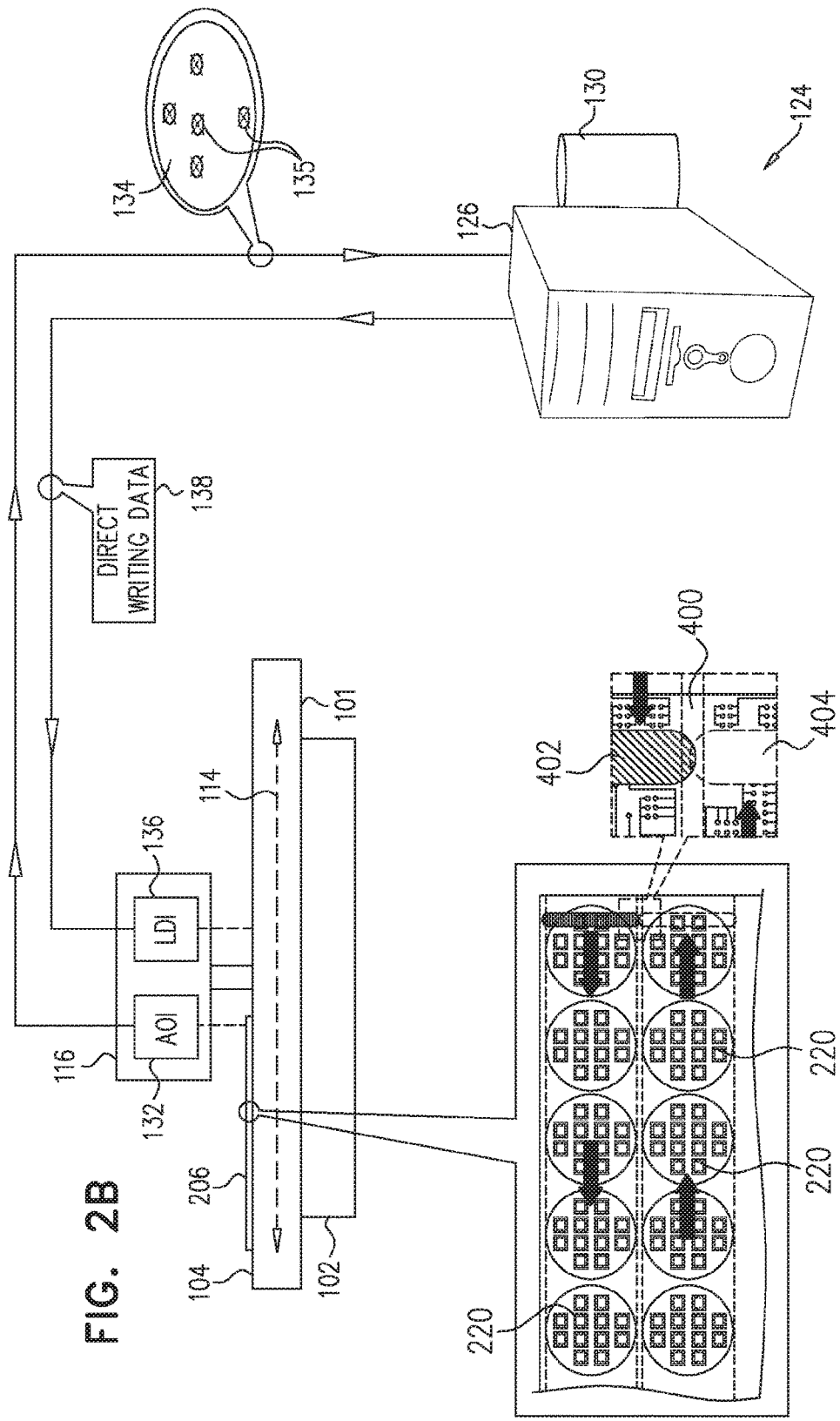

Reference is now made to FIGS. 2A and 2B, which are simplified illustrations of a system for computerized direct writing constructed and operative in accordance with another preferred embodiment of the present invention.

As seen in FIGS. 2A and 2B, there is provided a system 200 for computerized direct writing, preferably comprising chassis 101 preferably mounted on a conventional optical supporting table 102 and preferably defining a substrate support surface 104 onto which a substrate to be patterned may be placed. Here, by way of example, the substrate to be patterned preferably comprises a semiconductor wafer 206 and the patterning typically defines dies on at least one surface of wafer 206 by exposing photoresist overlying the wafer surface to laser light. The direct writing process preferably prints a multiplicity of dies, which dies are arranged on the surface in accordance with a preferred embodiment of the present invention. Such dies may be integrated circuit dies or fan out dies, by way of example only.

Bridge 112 is arranged for linear motion relative to substrate support surface 104 along an axis parallel to first axis 114, defined with respect to chassis 101. In other embodiments (not shown) the bridge may be static and the support surface along with the substrate placed on it move, or both bridge and support surface move relative to each other. At least one read/write assembly 116 is arranged for selectable positioning relative to bridge 112 along second axis 118, perpendicular to first axis 114, thereby to enable multiple sequential parallel scans to be carried out over wafer 206, each scan producing a multiplicity of dies 220. Dies 220 are preferably but not necessarily identical and are preferably arranged one after the other in a direction parallel to axis 114 and side-by-side parallel to axis 118.

Alternatively, a plurality of ones of read/write assembly 116 may be arranged in a side-by-side fashion on bridge 112 along axis 118, thereby to enable plural scans to be simultaneously or partially simultaneously carried out by corresponding ones of the plurality of assemblies 116 over wafer 206, each scan producing a multiplicity of dies 220. Such plural scans are preferably but not necessarily parallel.

System 200 preferably also includes control assembly 124, preferably including computer 126 having user interface 128. Computer 126 preferably includes software modules operative to operate read/write assembly 116.

Control assembly 124 also preferably includes writing instruction database 130 containing computer aided design (CAD) instructions used, in accordance with an embodiment of the present invention for writing dies 220 on wafer 206.

In accordance with a preferred embodiment of the present invention, read/write assembly 116 preferably includes automated optical imaging subsystem (AOI) 132 operable for imaging wafer 206 to provide images 134 to computer 126. Such optical images 134 may include optical images of fiducials 135 on wafer 206, which fiducials 135 may be useful in registration and/or calibration of system 200.

At least one read/write assembly 116 further preferably includes a direct imaging subsystem such as laser direct imaging subsystem (LDI) 136 including an optical writer operable for laser writing onto wafer 206 for producing dies 220 in response to direct writing data 138 received from computer 126. It is appreciated that although both AOI subsystem 132 and LDI subsystem 136 are referred to herein as types of imaging subsystems, the imaging performed by each of the subsystems is of a mutually differing nature. AOI subsystem 132 performs optical imaging of wafer 206 in order to acquire optical images thereof, for the purpose of registration and calibration of system 200 prior to performance of direct writing on wafer 206. In contrast, LDI subsystem 136 performs direct writing on wafer 206 by laser imaging of a pattern on wafer 206.

By way of example, LDI 136 may comprise a laser scanner of the type described in U.S. Pat. No. 8,531,751, assigned to the same assignee as the present invention. Other examples of direct imaging systems suitable for use with the present invention include a Direct Imaging System, model no. DW-3000, available from SCREEN Semiconductor of Tokyo, Japan and a Maskless Aligner System, model no MLA150, available from HEIDELBERG Instruments of Heidelberg, Germany.

Preferably, control assembly 124 and computer 126 thereof, receives from database 130 a CAD file containing electrical circuit design data for direct writing on wafer 206, the CAD file including CAD data for multiplicity of dies 220 to be produced on wafer 206.

Preferably, the control assembly 124 and more particularly computer 126 automatically configures read/write assembly 116 to direct write direct writing data based on the CAD data on the wafer 206 in plural parallel scans, each having a scan width less than the width of the substrate. It is appreciated that at least one read/write assembly 116 is thus a particularly preferred embodiment of a direct write machine, operative to direct write direct writing data on wafer 206. It is further appreciated that control assembly 124 including computer 126 may correspondingly be termed an automatic direct write machine configuration (ADWMC) unit, operative to receive a CAD file containing electrical circuit design data for direct writing on at least one surface of wafer 206 and to automatically configure the direct write machine comprising at least one read/write assembly 116 to direct write direct writing data based on the CAD data on wafer 206 in plural scans.

It is a particular feature of a preferred embodiment of the present invention that the control assembly 124 and more particularly computer 126 automatically configures the direct writing data for the multiplicity of dies to be written in a side by side manner in each of the plural scans so as to be within the scan width, so that no die is written in multiple scans, thereby obviating the need for stitching of direct writing data between adjacent scans.

Preferably the read/write assembly 116 is operated by the control assembly 124 to create multiplicity of dies 220 on the wafer 206 in plural scan passes, wherein the seam of adjacent scan passes is not located at a die, thereby obviating the need for stitching direct writing data between adjacent scans. The seam of adjacent scan passes may be an overlapping, a butting or a mutually spaced arrangement as will be described hereinbelow with reference to FIGS. 4A-4C. In accordance with a preferred embodiment of the present invention, irrespective of what type of seam exists, the seam is arranged to be between dies and not overlaying dies.

It is appreciated that plural scan passes are typically required in order to scan a full width of wafer 206, due to an inherent limitation in the maximum scan length provided by LDI 136. Such plural scan passes may either be sequentially performed by a single repositionable scan head or at least partially simultaneously performed by a number of scans heads operating in parallel. This limitation in the scan length is dictated, among other factors, by a critical ratio that must be maintained between the required size of the focused laser beam performing direct writing on the wafer surface and the scan length of the scanning lens of LDI 136. By way of example, in order to provide a laser spot having the required resolution for direct writing of electrical circuit data on dies 220, LDI 136 may be limited to providing a maximum scan length of approximately 100 mm. This results in a wafer having a width of 300 mm requiring three scan passes in order to scan a full width thereof.

Were it not for the direct writing data for the multiplicity of dies 220 being written in each of the scans so as to be within the scan width, with the seam of adjacent scan passes located between rather than overlying dies 220, as provided by the present invention, adjacent scan passes of the multiple required scans would typically overly the dies. Consequently, in the absence of the automatic direct writing configuration provided by the present invention, electrical circuit features within the dies would inevitably be exposed by more than one scan pass, leading to stitching effects due to mechanical and optical errors aggregated at the overlap between scan passes. Such stitching effects, as well as various complex techniques typically required in order to mitigate the influence thereof, are advantageously obviated in the present invention due to avoidance of overlap between scan passes.

It is understood that wafer 206 is not limited to being a single-layer substrate having only single-layer dies 220 patterned thereon. Rather, system 200 may be employed in an additive manner, so as to selectively modify a wafer layer by layer in order to create a three dimensional structure. Dies 220 may thus be formed of multiple layers, which multiple layers may be sequentially written over each other in registration by read/write assembly 116. In the case that dies 220 are formed of multiple layers, read/write assembly 116 is preferably automatically configured to direct write direct writing data for each of the multiple layers in plural scans in accordance with the manner detailed hereinabove, wherein each scan has a scan width less than a width of the surface of wafer 206, including arranging the direct writing data for multiple layers of the dies 220 to be written in a side by side manner in each of the plural scans so as to be within the scan width, whereby stitching of direct writing data between adjacent scans is obviated.

Figure 3A:
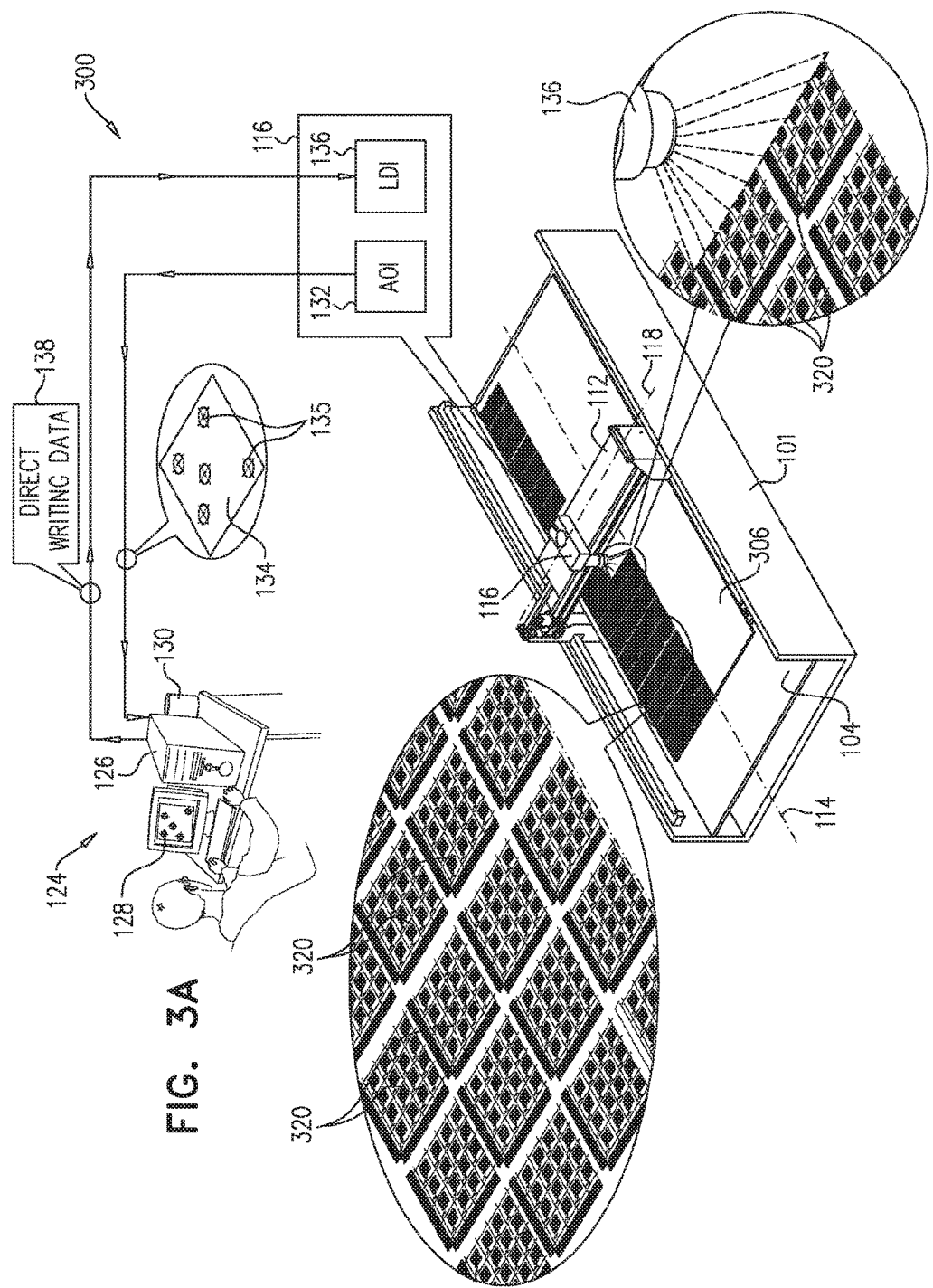
FIGS. 3A and 3B are simplified illustrations of a system for computerized direct writing constructed and operative in accordance with yet another preferred embodiment of the present invention.
Figure 3B:
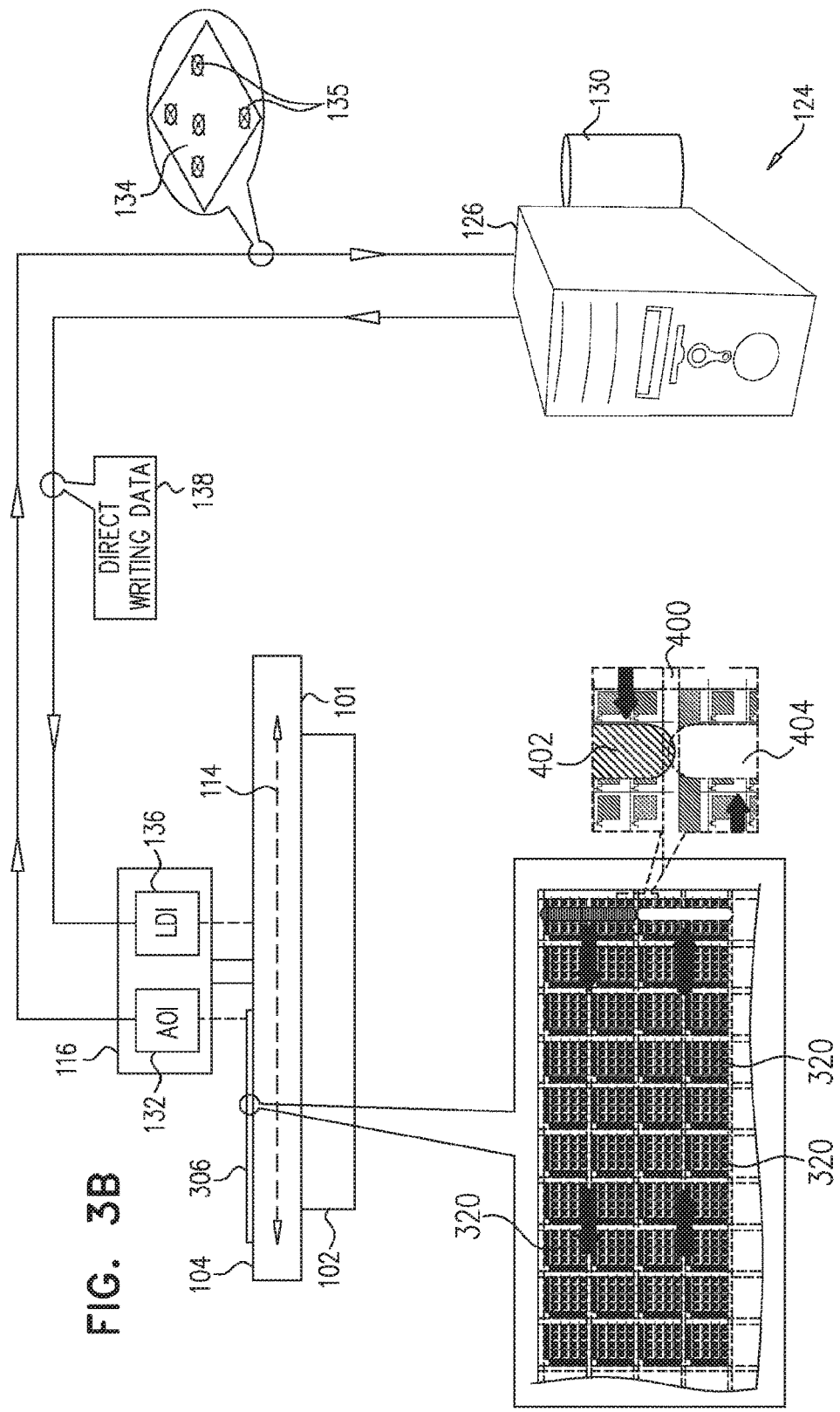

Reference is now made to FIGS. 3A and 3B, which are simplified illustrations of a system for computerized direct writing constructed and operative in accordance with a further preferred embodiment of the present invention.

As seen in FIGS. 3A and 3B, there is provided a system 300 for computerized direct writing, preferably comprising chassis 101 preferably mounted on a conventional optical supporting table 102 and preferably defining a substrate support surface 104 onto which a substrate to be patterned may be placed. Here, by way of example, the substrate to be patterned preferably comprises a flat panel display 306 and the patterning typically defines elements on at least one surface of display 306 by exposing photoresist overlying the display surface to laser light. The direct writing process preferably prints a matrix or multiplicity of cells, which cells are arranged on the surface in accordance with a preferred embodiment of the present invention.

Bridge 112 is arranged for linear motion relative to substrate support surface 104 along an axis parallel to first axis 114, defined with respect to chassis 101. In other embodiments (not shown) the bridge may be static and the support surface along with the substrate placed on it move, or both bridge and support surface move relative to each other. At least one read/write assembly 116 is arranged for selectable positioning relative to bridge 112 along second axis 118, perpendicular to first axis 114, thereby to enable multiple sequential parallel scans to be carried out over panel 306, each scan producing a multiplicity of cells 320. Cells 320 are preferably but not necessarily identical and are preferably arranged one after the other in a direction parallel to axis 114 and side-by-side parallel to axis 118.

Alternatively, a plurality of ones of read/write assembly 116 may be arranged in a side-by-side fashion on bridge 112 along axis 118, thereby to enable plural scans to be simultaneously or partially simultaneously carried out by corresponding ones of the plurality of assemblies 116 over panel 306, each scan producing a multiplicity of cells 320. Such plural scans are preferably but not necessarily parallel.

System 300 preferably also includes control assembly 124, preferably including computer 126 having user interface 128. Computer 126 preferably includes software modules operative to operate read/write assembly 116.

Control assembly 124 also preferably includes writing instruction database 130 containing computer aided design (CAD) instructions used, in accordance with an embodiment of the present invention for writing cells 320 on panel 306.

In accordance with a preferred embodiment of the present invention, read/write assembly 116 preferably includes automated optical imaging subsystem (AOI) 132 operable for imaging panel 306 to provide images 134 to computer 126. Such optical images 134 may include optical images of fiducials 135 on panel 306, which fiducials 135 may be useful in registration and/or calibration of system 300.

Read/write assembly 116 further preferably includes a direct imaging subsystem such as laser direct imaging subsystem (LDI) 136 including an optical writer operable for laser writing onto panel 306 for producing cells 320 in response to direct writing data 138 received from computer 126. It is appreciated that although both AOI subsystem 132 and LDI subsystem 136 are referred to herein as types of imaging subsystems, the imaging performed by each of the subsystems is of a mutually differing nature. AOI subsystem 132 performs optical imaging of panel 306 in order to acquire optical images thereof, for the purpose of registration and calibration of system 300 prior to performance of direct writing on panel 306. In contrast, LDI subsystem 136 performs direct writing on panel 306 by laser imaging of a pattern on panel 306.

By way of example, LDI 136 may comprise a laser scanner of the type described in U.S. Pat. No. 8,531,751, assigned to the same assignee as the present invention. Other examples of direct imaging systems suitable for use with the present invention include a Direct Imaging System, model no. DW-3000, available from SCREEN Semiconductor of Tokyo, Japan and a Maskless Aligner System, model no. MLA150, available from HEIDELBERG Instruments of Heidelberg, Germany.

Preferably, control assembly 124 and computer 126 thereof, receives from database 130 a CAD file containing electrical circuit design data for direct writing on panel 306, the CAD file including CAD data for multiplicity of cells 320 to be produced on panel 306.

Preferably, the control assembly 124 and more particularly computer 126 automatically configures at least one read/write assembly 116 to direct write direct writing data based on the CAD data on the panel 306 in plural parallel scans, each having a scan width less than the width of the substrate. It is appreciated that at least one read/write assembly 116 is thus a particularly preferred embodiment of a direct-write machine, operative to direct write direct writing data on panel 306 It is further appreciated that control assembly 124 including computer 126 may correspondingly be termed an automatic direct write machine configuration (ADWMC) unit, operative to receive a CAD file containing electrical circuit design data for direct writing on at least one surface of panel 306 and to automatically configure the direct write machine comprising read/write assembly 116 to direct write direct writing data based on the CAD data on panel 306 in plural scans.

It is a particular feature of a preferred embodiment of the present invention that the control assembly 124 and more particularly computer 126 automatically configures the direct writing data for the multiplicity of cells 320 to be written in a side by side manner in each of the plural scans so as to be within the scan width, so that no cell is written in multiple scans, thereby obviating the need for stitching of direct writing data between adjacent scans.

Preferably the read/write assembly 116 is operated by the control assembly 124 to create multiplicity of cells 320 on the panel 306 in plural scan passes, wherein the seam of adjacent scan passes is not located within a cell, thereby obviating the need for stitching direct writing data between adjacent scans. The seam of adjacent scan passes may be an overlapping, a butting or a mutually spaced arrangement as will be described hereinbelow with reference to FIGS. 4A-4C. In accordance with a preferred embodiment of the present invention, irrespective of what type of seam exists, the seam is arranged to be between elements and not overlying elements.

It is appreciated that plural scan passes are typically required in order to scan a full width of panel 306, due to an inherent limitation in the maximum scan length provided by LDI 136. Such plural scan passes may either be sequentially performed by a single repositionable scan head or at least partially simultaneously performed by a number of scans heads operating in parallel. This limitation in the scan length is dictated, among other factors, by a critical ratio that must be maintained between the required size of the focused laser beam performing direct writing on the panel surface and the scan length of the scanning lens of LDI 136. By way of example, in order to provide a laser spot having the required resolution for direct writing of electrical circuit data on cells 320, LDI 136 may be limited to providing a maximum scan length of approximately 300 mm. This results in a panel having a width of 2400 mm requiring approximately 8 scan passes in order to scan a full width thereof.

Were it not for the direct writing data for the multiplicity of cells 320 being written in each of the scans so as to be within the scan width, with the seam of adjacent scan passes located between rather than overlying cells 320, as provided by the present invention, adjacent scan passes of the plural required scans would typically overly the cells. Consequently, in the absence of the automatic direct writing configuration provided by the present invention, electrical circuit features within the cells would inevitably be exposed by more than one scan pass, leading to stitching effects due to mechanical and optical errors aggregated at the overlap between scan passes. Such stitching effects, as well as various complex techniques typically required in order to mitigate the influence thereof, are advantageously obviated in the present invention due to avoidance of overlap between scan passes.

It is understood that panel 306 may be any flat panel display, various types of which are well known in the art, including LCD. OLED, or flexible displays. Furthermore, panel 306 is not limited to being a single-layer substrate having only single-layer cells 320 patterned thereon. Rather, system 300 may be employed in an additive manner, so as to selectively modify a panel layer by layer in order to create a three dimensional structure. Cells 320 may thus be formed of multiple layers, which multiple layers may be sequentially written over each other in registration by read/write assembly 116. In the case that cells 320 are formed of multiple layers, read/write assembly 116 is preferably automatically configured to direct write direct writing data for each of the multiple layers in plural scans in accordance with the manner detailed hereinabove, wherein each scan has a scan width less than a width of the surface of panel 306, including arranging the direct writing data for the multiple layers of the cells 320 to be written in a side by side manner in each of the plural scans so as to be within the scan width, whereby stitching of direct writing data between adjacent scans is obviated.

Figure 4A:
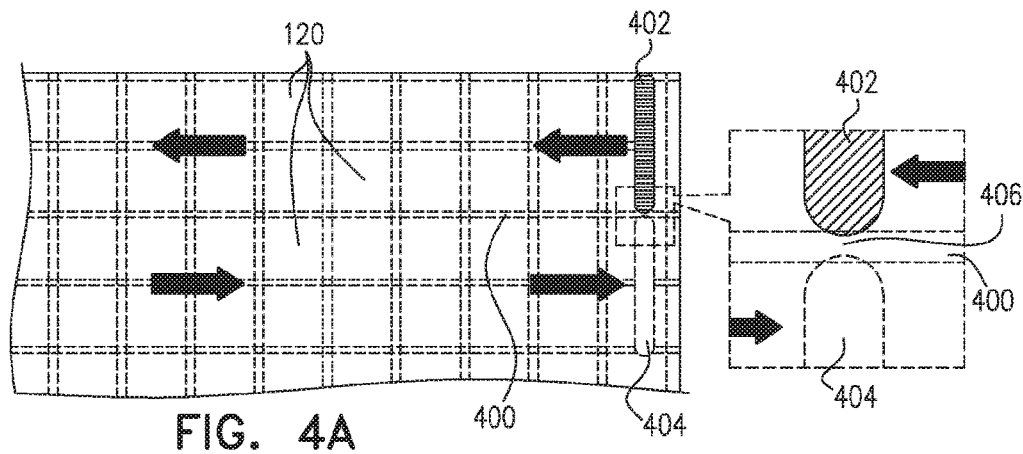
FIGS. 4A, 4B & 4C are simplified illustrations of a typical object arrangement, as shown in FIG. 1A, showing three respective possible scan patterns in accordance with a preferred embodiment of the present invention.

Reference is now made to FIGS. 4A. 4B & 4C, which are simplified illustrations of three alternative plural sequential scan pass arrangements, all of which are characterized, in accordance with a particular feature of an embodiment of the present invention, in that the seam between the scan passes lie along "streets", here designated by reference numeral 400.

It is appreciated that plural sequential scan passes are produced by operating the apparatus described hereinabove with reference to FIGS. 1A-3B initially with the read/write assembly 116 in a first position along axis 118 and producing a first scan pass, designated by reference numeral 402, along axis 114 and then subsequently repositioning the read/write assembly 116 to be in a second position along axis 118 to produce a second scan pass, designated 404, parallel to the first scan pass 402. Depending on the size of the machinery and the required resolution, more than two scan passes may be utilized to direct write all of the objects on a given substrate, which objects may be dies 220, as illustrated in FIGS. 2A and 2B, cells 320 of a flat panel display, as illustrated in FIGS. 3A and 3B, or any other suitable objects.

Alternatively, a plurality of ones of read/write assembly 116 may be provided, preferably arranged in a side-by-side manner along axis 118. The individual read/write assemblies 116 of the plurality of read/write assemblies preferably operate simultaneously or partially simultaneously to produce a plurality of preferably parallel scan passes, each scan pass having a scan width less than a width of the substrate. In such an arrangement, the first scan pass 402 produced by a first one the read/write assemblies may be carried out simultaneously with the second scan pass 404 produced by a second one of the read/write assemblies.

FIG. 4A shows an arrangement wherein respective scan passes 402 and 404 are separated by a gap 406, which overlies a street 400 between adjacent rows of objects 120. Here the seam between adjacent scan passes 402, 404 is a gap.

Figure 4B:
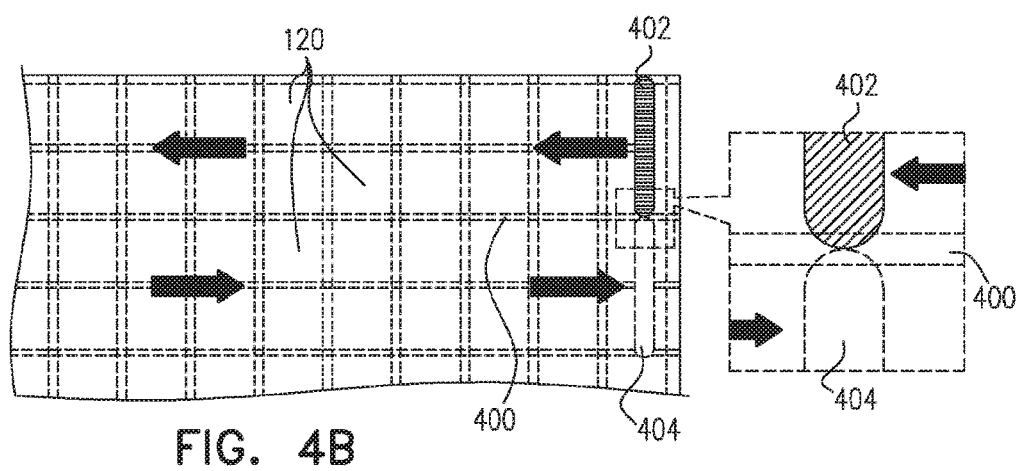

FIG. 4B shows an arrangement wherein respective scan passes 402 and 404 are butting at a location overlying a street 400 between adjacent rows of objects 120. Here the seam between adjacent scan passes 402, 404 is a butting.

Figure 4C:
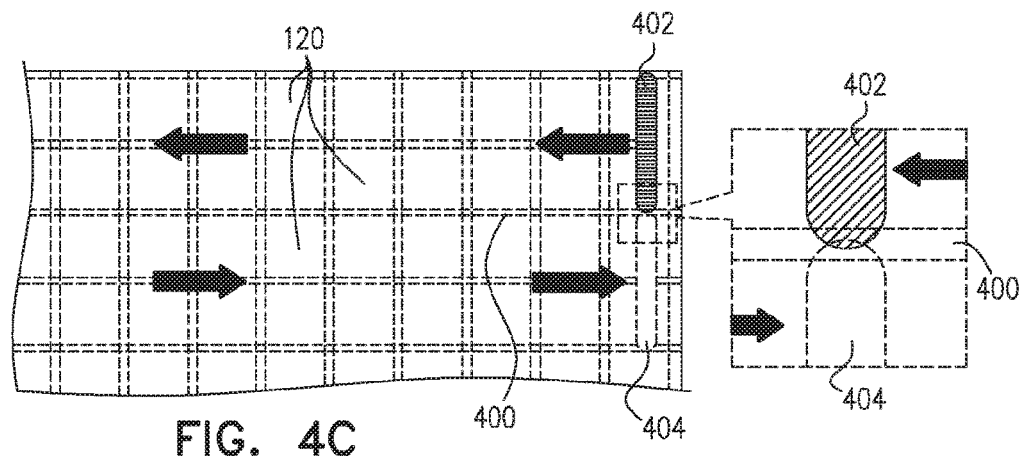

FIG. 4C shows an arrangement wherein respective scan passes 402 and 404 are partially overlapping at a location overlying a street 400 between adjacent rows of objects 120. Here the seam between adjacent scan passes 402, 404 is a partial overlap.

It should be appreciated that although streets 400 are illustrated in FIGS. 4A-4C as being linear, this is not necessarily the case. Objects 120 may alternatively be arranged so as to be spaced apart by non-linear streets, with the seam between adjacent scan passes being located within such streets rather than overlying objects 120, as will be readily understood by one skilled in the art.

Figure 5:
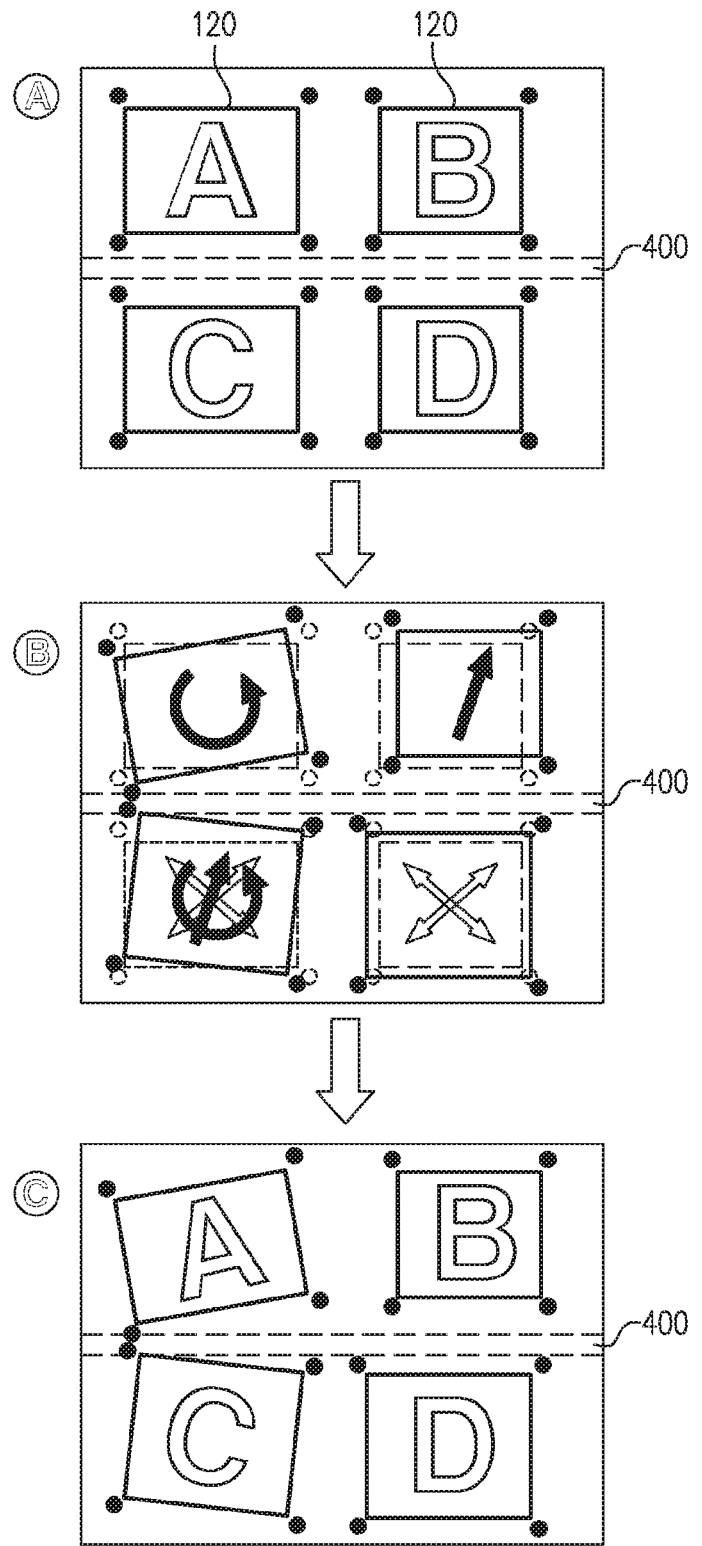
FIG. 5 is a simplified illustration demonstrating three successive states in adapting CAD data for direct writing in accordance with a preferred embodiment of the present invention.

Reference is now made to FIG. 5, which illustrates three successive operative stages in in the operation of any of systems 100, 200, 300 of FIGS. 1A-3B in accordance with a preferred embodiment of the present invention.

In accordance with a preferred embodiment of the present invention, the automatically configuring of the direct writing data includes modifying data derived from the CAD file to take into account at least one of inaccuracies and distortions in at least one of the configuration and location of the substrate.

Turning to FIG. 5, at A a representation of an arrangement of the CAD data is shown in which objects 120 are arranged in a grid pattern separated by streets 400, along one or more of which seams between adjacent scan passes are located. At B, a representation of AOI data showing distortions in the substrate at the locations of each of the objects 120 appears. At C, there is shown a representation of direct writing data, which is configured to compensate for the distortions in B and to ensure that the seams of the scan passes overlie the streets 400 and not the objects 120. It is appreciated that in order to accommodate the distortions, the widths of the streets 400 may need to be narrowed. In cases of extreme distortions, an alarm may be sent to an operator to require the operator to manually reorient the substrate so as to ensure that the seams do not overlie the objects 120.

It should be appreciated that although the above description of FIG. 5 refers to objects 120, such nomenclature is for simplicity and generality of description only, and objects 120 may be embodied, by way of example, as dies 220 or cells 320.

It should further be appreciated that such automatic configuration to compensate for distortion may be done prior to the writing operation for the whole panel, based upon AOI data acquired in advance to the writing operation, or dynamically during each scan following AOI data acquired 'on the fly'.

It should also be appreciated that configurational changes may be performed in response to a whole substrate change, for instance due to shifting or rotation of the support surface (e.g. in order to dynamically compensate for inaccurate translation of the support surface).

Figure 6A:
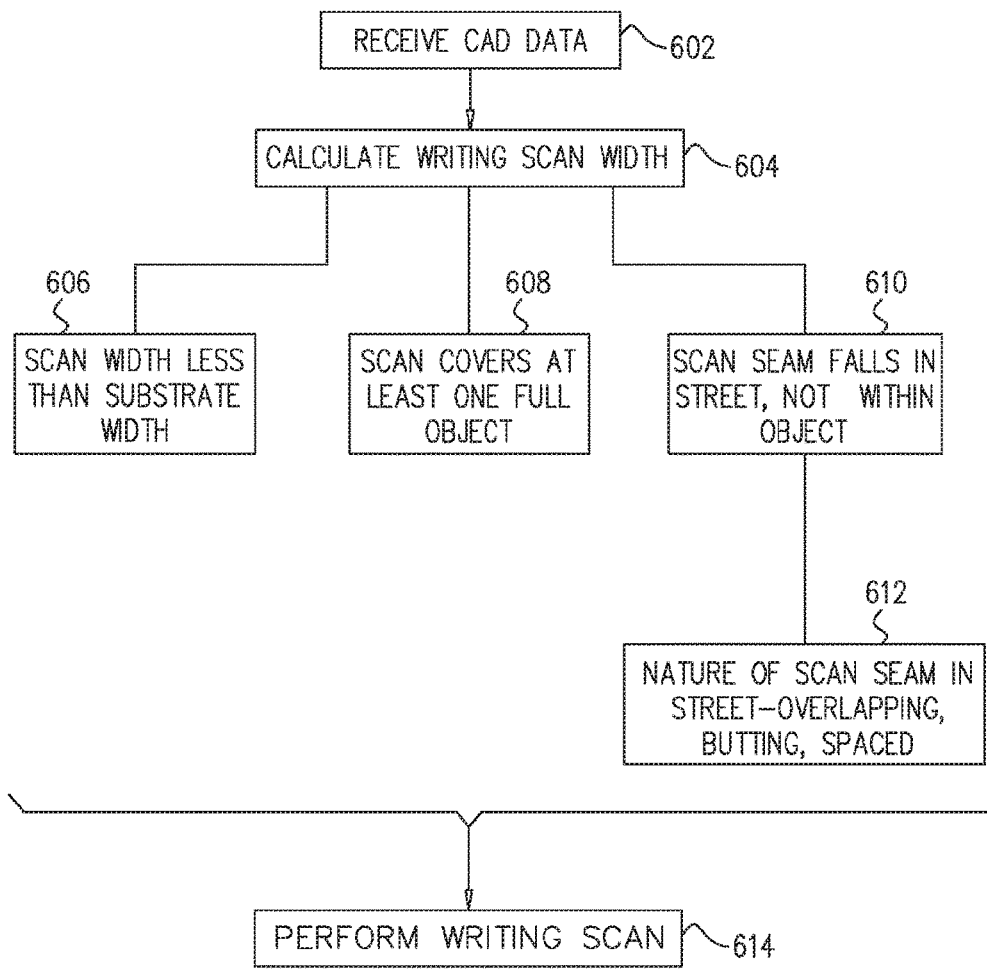
FIGS. 6A and 6B are simplified flow charts illustrating two alternative methodologies of automatic configuration of direct write machines.
Figure 6B:
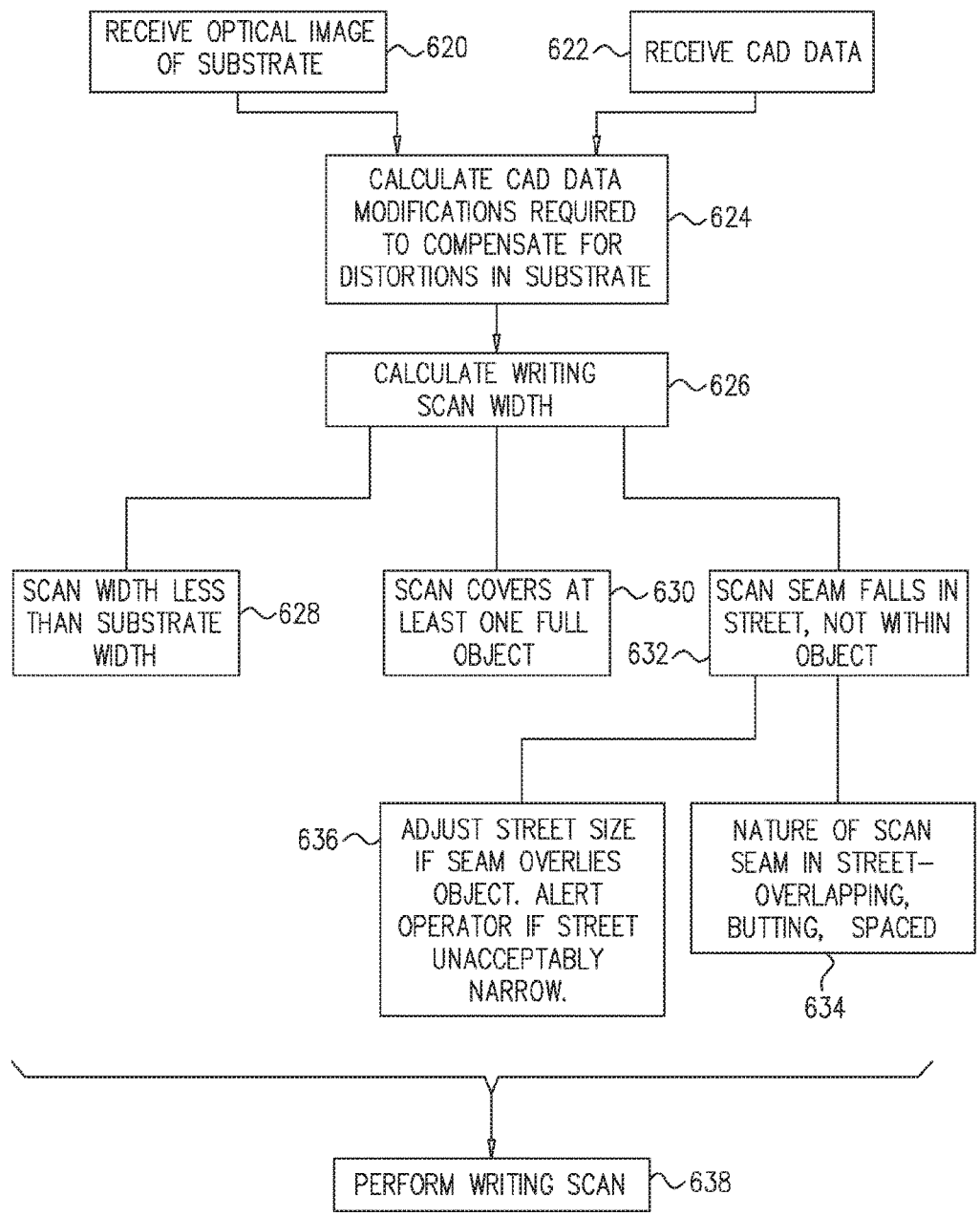

Reference is now made to FIGS. 6A and 6B, which are simplified flow charts illustrating two alternative methodologies of automatic configuration of direct write machines.

Turning now to FIG. 6A, CAD data is preferably received at a first step 602. CAD data received at first step 602 preferably comprises electrical circuit design data and includes an arrangement of objects and interfacing streets to be patterned on a substrate such as substrate 106, wafer 206 or flat panel display 306. Following receipt of CAD data at first step 602, scan width is preferably calculated at a second step 604. The scan width calculated at second step 604 must satisfy several requirements, including that the scan width is less than the width of the substrate as seen at a first requirement 606, that each scan covers a full object as seen at a second requirement 608, and that each scan seam falls so as to overly a street rather than within an object, as seen at a third requirement 610. Third requirement 610 also includes calculation of the nature of the scan seam within the street, as detailed with respect to FIGS. 4A-4C, and involves calculation of whether the seams between adjacent scans and within streets are spaced apart, butting or overlapping, as seen at fourth requirement 612. Following calculation of scan width at second step 604, a writing scan is preferably performed at a third step 614.

It is appreciated that the methodology illustrated in FIG. 6A does not take into account inaccuracies or distortions that may be present in the topology of the substrate and corresponding modifications that may be required to the CAD data as a result. An exemplary methodology including automatic configuration of a direct write machine in accordance with preferred embodiments of the present invention, so as to take into account possible distortions in the substrate topology is illustrated in FIG. 6B.

As seen in FIG. 6B, an optical image of the substrate is received at a first step 620 and CAD data is received at a second step 622. Although steps 620 and 622 are illustrated in parallel in FIG. 6B, it should be appreciated that steps 620 and 622 may be performed simultaneously or may be performed sequentially, with either one of the steps preceding the other.

Modifications to the CAD data in order to take into account distortions in the substrate based on the optical image are then calculated at a third step 624. It should be appreciated that such modifications may include global adjustments to the CAD data, for example due to a distortion in the location of the entirety of the substrate, and/or may include localized adjustments to the CAD data, for example due to warping in individual locations on the substrate. Such modification may be carried out in accordance with methods described in U.S. Pat. Nos. 7,508,515 and 8,769,471, or in accordance with other suitable methods known in the art.

'Scan width is preferably subsequently calculated at a fourth step 626. The scan width calculated at fourth step 626 must satisfy several requirements, including that the scan width is less than the width of the substrate as seen at a first requirement 628, that each scan covers a full object as seen at a second requirement 630, and that each scan seam falls so as to overly a street rather than within an object, as seen at a third requirement 632.

Third requirement 632 also includes calculation of the nature of the scan seam within the street, as detailed with respect to FIGS. 4A-4C, and involves calculation of whether the seams between adjacent scans and within streets are spaced apart, butting or overlapping, as seen at a fourth requirement 634. In order to satisfy third requirement 632, adjustment of street size and orientation may be required, as seen at a fifth step 636. In the case that the street size as adjusted is found to be unacceptably narrow, an alert may be provided to an operator of the system indicating that manual relocation of the substrate is necessary in order to correct positioning of the substrate.

Following calculation of scan width at fourth step 626, a writing scan is preferably performed at a sixth step 638.

Figure 7A:
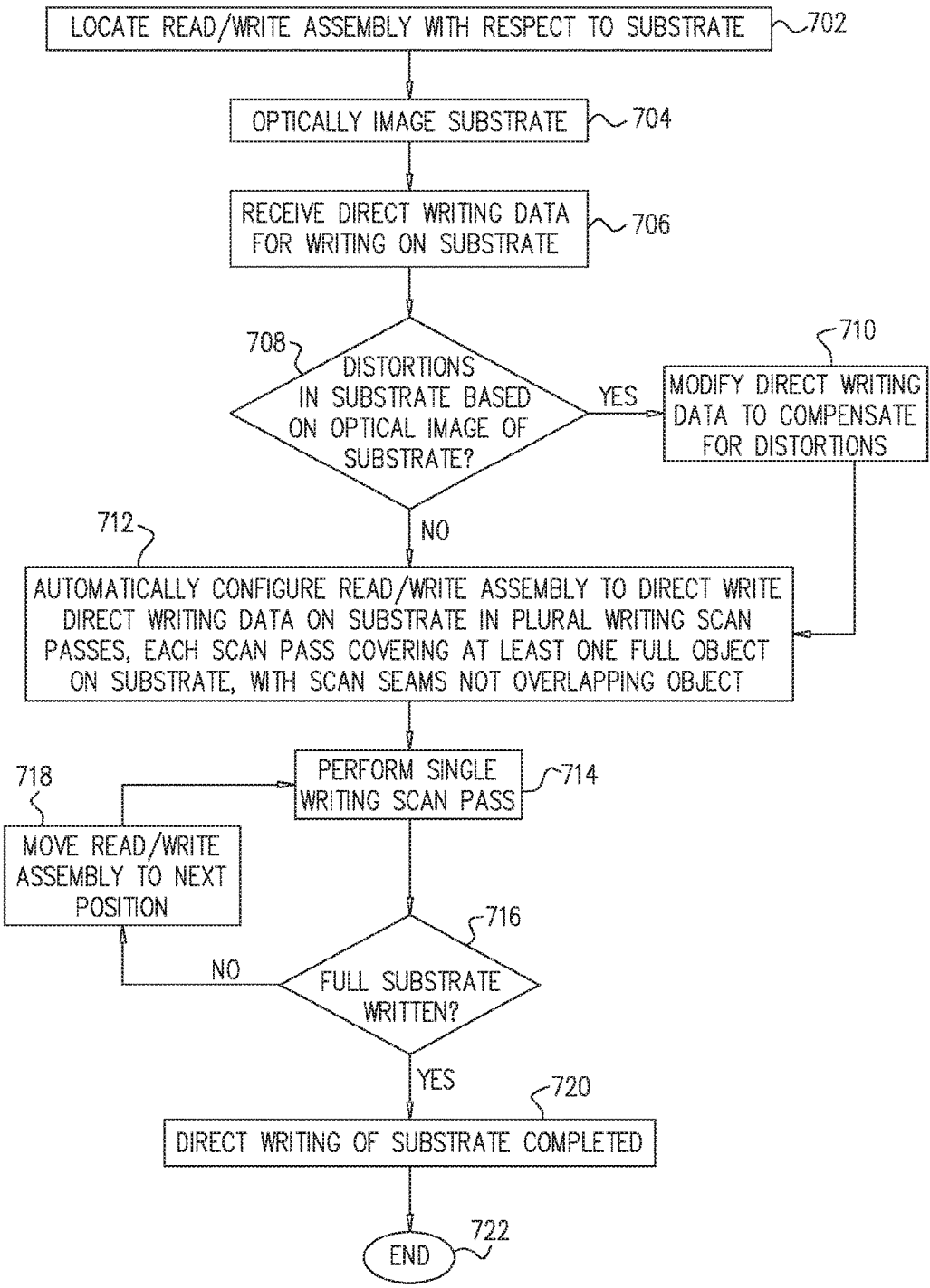
FIGS. 7A and 7B are simplified flow charts respectively illustrating the operation of two alternative embodiments of the present invention.
Figure 7B:
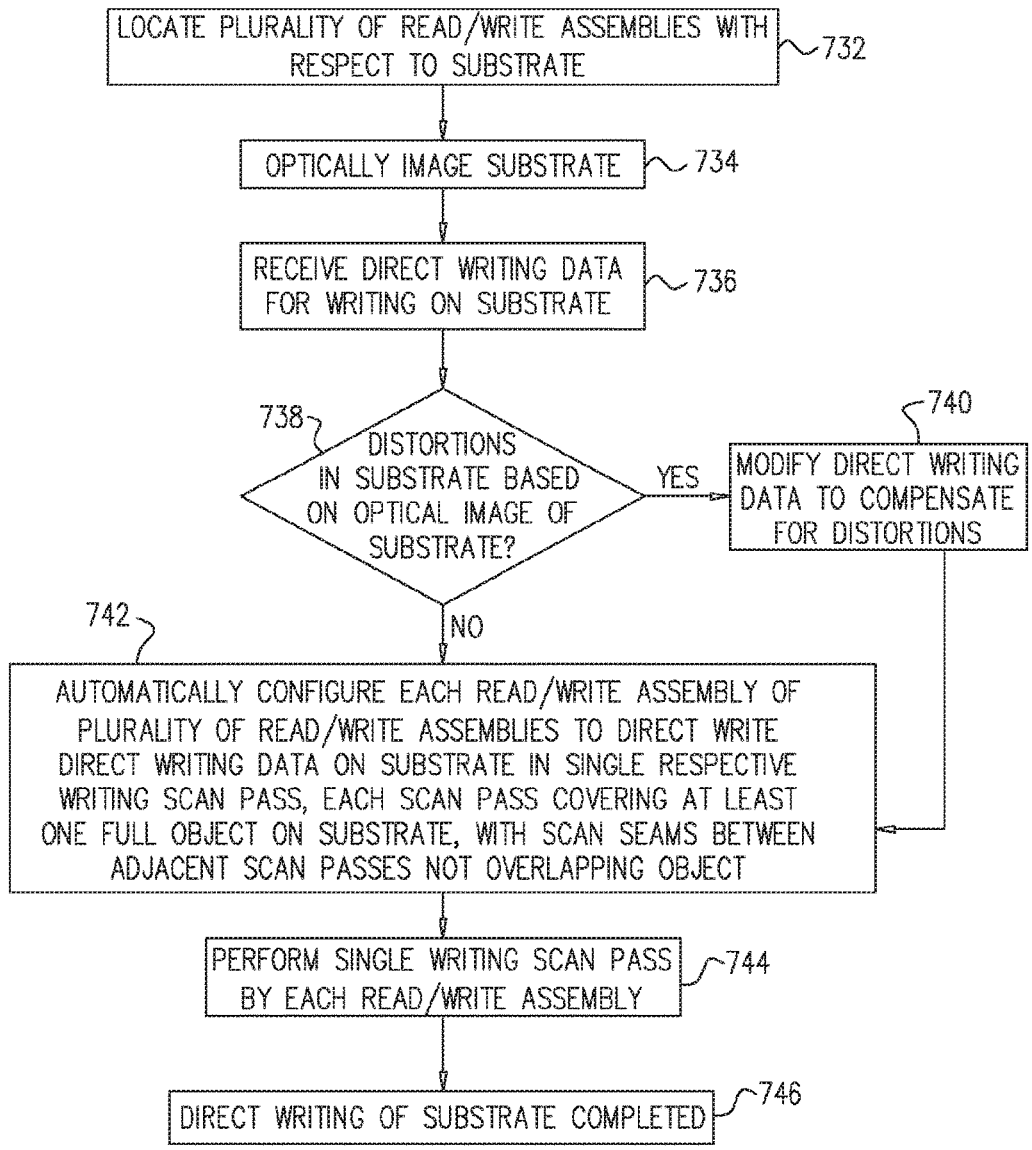

Reference is now made to FIGS. 7A and 7B, which are simplified flow charts respectively illustrating operation of two alternative embodiments of the present invention.

Turning now to FIG. 7A, as seen at a first step 702, a read/write assembly is preferably located with respect to a substrate to be patterned. The substrate is then optically imaged by an optical imaging component of the read/write assembly, as seen at a second step 704. Such optical imaging preferably includes the optical imaging of fiducials on the substrate, for the purpose of initial registration, as well as optical imaging in order to detect the presence of local and/or global distortions in the substrate. Direct writing data for direct writing on the substrate is preferably received by the read/write assembly at a third step 706. In the case that the optical image of the substrate indicates distortions in the substrate, the direct writing data is preferably modified so as to take into account those distortions, as seen at fourth and fifth steps 708 and 710 respectively.

The read/write assembly is then preferably automatically configured at a sixth step 712 to direct write direct writing data on the substrate in plural scan passes, each scan pass covering at least one full object to be patterned on the substrate, with scan seams not overlying the objects, preferably in accordance with the methodologies detailed with respect to FIGS. 6A and 6B.

Following such automatic configuration, a single scan pass is preferably performed at seventh step 714. In the case that additional scan passes are subsequently required in order to cover a full width of the substrate, the read/write assembly is preferably relocated with respect to the substrate and additional scanning passes performed as necessary, as seen at eighth and ninth steps 716 and 718 respectively. Scanning is considered to be completed once direct writing has been performed on a full width of the substrate, as seen at tenth and eleventh steps 720 and 722 respectively.

It should be appreciated that the method of operation outlined with reference to FIG. 7A is applicable to a system including a single read/write assembly, which read/write assembly is preferably repeatedly repositioned with respect to the substrate in order to carry out plural sequential scan passes. An alternative possible method of operation, applicable to a system including a plurality of read/write assemblies operating at least partially simultaneously, is outlined with reference to FIG. 7B.

Turning now to FIG. 7B, as seen at a first step 732, a plurality of read/write assemblies is preferably located with respect to a substrate to be patterned. The substrate is then optically imaged, as seen at a second step 734. Such optical imaging preferably includes the optical imaging of fiducials on the substrate, for the purpose of initial registration, as well as optical imaging in order to detect the presence of local and/or global distortions in the substrate. Direct writing data for direct writing on the substrate is preferably received by each of the read/write assemblies at a third step 736. In the case that the optical image of the substrate indicates distortions in the substrate, the direct writing data is preferably modified so as to take into account those distortions, as seen at fourth and fifth steps 738 and 740 respectively.

Each read/write assembly of the plurality of read/write assemblies is then preferably automatically configured at a sixth step 742 to direct write direct writing data on the substrate in a single scan pass, each scan pass covering at least one full object to be patterned on the substrate, with scan seams not overlying the objects, preferably in accordance with the methodologies detailed with respect to FIGS. 6A and 6B.

Following such automatic configuration, a single scan pass is preferably simultaneously performed by each read/write assembly of the plurality of read/write assemblies at a seventh step 744, such that the sum of the scan passes performed by the plurality of read/write assemblies preferably covers a full width of the substrate and writing of the substrate is completed, as seen at an eighth step 746.

It should be appreciated that the methodologies illustrated in FIGS. 6A and 6B and modes of operation illustrated in FIGS. 7A and 7B are highly simplified and may involve additional steps, preceding, intervening between or following those steps illustrated. Furthermore, the steps illustrated in FIGS. 6A-7B are not necessarily performed in the order illustrated and described and may be reordered.

It will be appreciated by persons skilled in the art that the present invention is not limited by what has been particularly shown and described hereinabove. Rather the scope of the present invention includes both combinations and sub-combination of the various features described hereinabove as well as variations thereof which would occur to persons skilled in the art, which are not in the prior art.

The invention claimed is:

1. A method of manufacture of electrical circuits comprising:

receiving a CAD file containing electrical circuit design data for direct writing on a substrate, said CAD file including CAD data for a multiplicity of dies to be produced on said substrate;

generating an image of said substrate, said image including images of fiducials on said substrate;

generating modified CAD data by calculating modifications to said CAD data based on said image of said substrate;

automatically configuring a direct write machine to direct write direct writing data based on said modified CAD data on said substrate in plural scans, each of said plural scans having a scan width less than a width of said substrate, including arranging said direct writing data for said multiplicity of dies to be written in a side by side manner in each of said plural scans so as to be within said scan width, whereby a single layer of each of said multiplicity of dies is written in a single scan of said plural scans, whereby stitching of direct writing data between adjacent scans is obviated; and operating said direct write machine to create said multiplicity of dies on said substrate, said automatically configuring also comprising:

defining a seam between adjacent ones of said plural scans, said seam being an overlapping seam; and ensuring that each of said seams is not located within any of said multiplicity of dies, said ensuring comprising:

arranging said direct writing data for said multiplicity of dies such that plural dies of said multiplicity of dies are to be written in a side by side manner in each of said plural scans, adjacent ones of said plural dies being written by adjacent ones of said plural scans being separated from each other by a street; and arranging said direct writing data such that said seam lies along said street and does not overlie any one of said multiplicity of dies.

2. A method of manufacture of electrical circuits according to claim 1, and wherein said generating an image of said substrate comprises performing optical imaging of said substrate.

3. A method of manufacture of electrical circuits according to claim 2 and wherein said generating modified CAD data comprises modifying data derived from said CAD file to take into account at least one of inaccuracies and distortions in a configuration of said substrate, as found by said optical imaging.

4. A method of manufacture of electrical circuits according to claim 1 and wherein the direct writing data is configured such that no die is written by more than said single scan of said plural scans.

5. A method of manufacture of electrical circuits according to claim 1 and wherein said dies are formed of multiple layers, said multiple layers being sequentially written over each other in registration.

6. A method of manufacture of electrical circuits according to claim 5 and wherein said automatically configuring comprises automatically configuring said direct write machine to direct write direct writing data for each of said multiple layers based on said modified CAD data on said substrate in said plural scans, each having a scan width less than said width of said substrate including arranging said direct writing data for said multiple layers of said multiplicity of dies to be written in a side by side manner in each of said plural scans so as to be within said scan width, whereby stitching of direct writing data between adjacent scans is obviated.

7. A method of manufacture of electrical circuits according to claim 1, wherein said direct write machine comprises a single read/write assembly, said plural scans being sequentially performed by said read/write assembly.

8. A method of manufacture of electrical circuits according to claim 1, wherein said direct write machine comprises two or more read/write assemblies, said plural scans being performed by said read/write assemblies operating at least partially mutually simultaneously.

9. A system for manufacture of electrical circuits comprising:
a direct write machine;
an imaging subsystem operable to generate an image of a substrate, said image of said substrate including images of fiducials on said substrate; and
an automatic direct write machine configuration (ADWMC) unit comprising a non-transitory computer readable medium having stored thereon a CAD file containing electrical circuit design data for direct writing on said substrate, said CAD file including CAD data for a multiplicity of dies to be produced on said substrate, said ADWMC being configured to:
generate modified CAD date by calculating modifications to said CAD data based on said image of said substrate,
automatically configure said direct write machine to direct write direct writing data based on said modified CAD data on said substrate in plural scans,
each of said plural scans having a scan width less than a width of said substrate, including arranging said direct writing data for said multiplicity of dies to be written in a side by side manner in each of said plural scans so as to be within said scan width, so that a single layer of each of said multiplicity of dies is written in a single scan of said plural scans, and so that stitching of direct writing data between adjacent scans is obviated, said ADWMC also being configured to:
define a seam between adjacent ones of said plural scans, said seam being an overlapping seam; and
ensure that each of said seams is not located within any of said multiplicity of dies by:
arranging said direct writing data for said multiplicity of dies such that plural dies of said multiplicity of dies are to be written in a side by side manner in each of said plural scans, adjacent ones of said plural dies being written by adjacent ones of said plural scans being separated from each other by a street; and
arranging said direct writing data such that seam lies along said street and does not overlie any one of said multiplicity of dies.

10. A system for manufacture of electrical circuits according to claim 9, and wherein said imaging subsystem comprises an optical imager for performing optical imaging of said substrate.

11. A system for manufacture of electrical circuits according to claim 10 and wherein said modified CAD data is derived by taking into account at least one of inaccuracies and distortions in a configuration of said substrate, as found by said optical imaging.

12. A system for manufacture of electrical circuits according to claim 9 and wherein the direct writing data is configured such that no die is written by more than said single scan of said plural scans.

13. A system for manufacture of electrical circuits according to claim 9 and wherein said dies are formed of multiple layers, said multiple layers being sequentially written over each other in registration.

14. A system for manufacture of electrical circuits according to claim 13 and wherein said ADWMC unit automatically configures said direct write machine to direct write direct writing data for each of said multiple layers based on said modified CAD data on said substrate in plural scans, each having a scan width less than a width of said substrate, including arranging said direct writing data for said multiple layers of said multiplicity of dies to be written in a side by side manner in each of said plural scans so as to be within said scan width, whereby stitching of direct writing data between adjacent scans is obviated.

15. A system for manufacture of electrical circuits according to claim 9, wherein said direct write machine comprises a single read/write assembly, said plural scans being sequentially performed by said read/write assembly.

16. A system for manufacture of electrical circuits according to claim 9, wherein said direct write machine comprises two or more read/write assemblies, said plural scans being performed by said read/write assemblies operating at least partially mutually simultaneously.

* * * * *